(12) United States Patent
Huh et al.

(10) Patent No.: US 11,855,556 B2
(45) Date of Patent: Dec. 26, 2023

(54) METHOD AND APPARATUS THAT PROVIDES POWER GENERATED FROM EXTERNAL ENERGY SIGNAL

(71) Applicant: Samsung Electronics Co., Ltd., Suwon-si (KR)

(72) Inventors: Yeunhee Huh, Namyangju-si (KR); Sang Joon Kim, Hwaseong-si (KR); Seungchul Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 738 days.

(21) Appl. No.: 16/794,709

(22) Filed: Feb. 19, 2020

(65) Prior Publication Data

US 2021/0067063 A1    Mar. 4, 2021

(30) Foreign Application Priority Data

Sep. 2, 2019  (KR) .......................... 10-2019-0108345

(51) Int. Cl.
*H01M 6/50*    (2006.01)
*H02N 2/18*    (2006.01)
(Continued)

(52) U.S. Cl.
CPC ........... *H02N 2/188* (2013.01); *H02J 7/0048* (2020.01); *H02J 7/00718* (2020.01); *H02J 7/06* (2013.01);
(Continued)

(58) Field of Classification Search
CPC .......... H02J 50/15; H02J 50/001; H02J 50/40; H02J 50/402
See application file for complete search history.

(56) References Cited

U.S. PATENT DOCUMENTS 7,084,605 B2 *   8/2006   Mickle ............... H02J 50/001
                                                         320/108
2004/0007942 A1   1/2004   Nishida et al.
(Continued)

FOREIGN PATENT DOCUMENTS

CN    101331503 B  * 12/2012   ........... H01Q 1/2225
CN    205990452 U  *  3/2017
(Continued)

OTHER PUBLICATIONS

Du, Sijun et al., "A Fully Integrated Split-Electrode Synchronized-Switch-Harvesting-on-Capacitors (SE-SSHC) Rectifier for Piezoelectric Energy Harvesting with Between 358% and 821% Power-Extraction Enhancement", *2018 IEEE International Solid—State Circuits Conference—(ISSCC)*, 2018 (pp. 152-154).
(Continued)

*Primary Examiner* — Arun C Williams
(74) *Attorney, Agent, or Firm* — NSIP Law

(57) ABSTRACT

A power providing device is provided. The power providing device includes a first energy harvester element configured to generate power in response to an external energy signal being received, a connection switching element configured to switch a connection between the first energy harvester element and a second energy harvester element; and a first rectifier comprising one or more path switching elements configured to change a rectification path in response to the switching of the connection switching element, wherein the first rectifier is connected to the first energy harvester element to rectify the power generated by the first energy harvester element along the rectification path.

30 Claims, 25 Drawing Sheets

(51) Int. Cl.
*H02J 50/15* (2016.01)
*H02J 7/00* (2006.01)
*H02J 50/00* (2016.01)
*H02J 7/06* (2006.01)
*H02M 7/219* (2006.01)
*H10N 30/06* (2023.01)
*H10N 30/30* (2023.01)

(52) U.S. Cl.
CPC .......... *H02J 50/001* (2020.01); *H02J 50/15* (2016.02); *H02M 7/219* (2013.01); *H02N 2/181* (2013.01); *H10N 30/06* (2023.02); *H10N 30/30* (2023.02)

(56) References Cited

U.S. PATENT DOCUMENTS

| | | | |
|---|---|---|---|
| 2006/0094425 A1* | 5/2006 | Mickle | G06K 19/0715 455/434 |
| 2008/0252174 A1 | 10/2008 | Mohammadi et al. | |
| 2008/0298100 A1* | 12/2008 | Esaka | H02J 50/402 363/67 |
| 2009/0067207 A1* | 3/2009 | Nishino | B60L 5/005 363/126 |
| 2009/0200985 A1* | 8/2009 | Zane | H01Q 5/42 320/108 |
| 2011/0266882 A1* | 11/2011 | Yamamoto | H02J 50/20 307/104 |
| 2011/0304240 A1 | 12/2011 | Meitav et al. | |
| 2012/0256494 A1* | 10/2012 | Kesler | H02J 50/40 307/104 |
| 2012/0314465 A1* | 12/2012 | Matsui | H02J 50/10 363/71 |
| 2013/0043734 A1* | 2/2013 | Stone | H02J 50/40 307/104 |
| 2014/0210423 A1* | 7/2014 | Goto | H02N 2/181 320/139 |
| 2015/0244176 A1* | 8/2015 | Van Den Brink | H02J 7/007 307/104 |
| 2016/0056660 A1* | 2/2016 | Cho | H02J 50/402 320/108 |
| 2017/0054302 A1* | 2/2017 | Nirantare | H02J 5/005 |
| 2017/0288463 A1* | 10/2017 | Nakahara | H02J 50/70 |
| 2017/0346344 A1* | 11/2017 | Uchimoto | H02J 7/00034 |
| 2018/0027077 A1* | 1/2018 | Melodia | G16H 40/67 370/254 |
| 2018/0062416 A1* | 3/2018 | Terry | H02J 50/402 |
| 2018/0287405 A1* | 10/2018 | Govindaraj | H02J 50/10 |
| 2018/0287484 A1* | 10/2018 | Braginsky | H02J 3/381 |
| 2019/0313908 A1* | 10/2019 | Melodia | A61B 5/7225 |
| 2020/0321809 A1* | 10/2020 | Ren | H04B 5/0081 |
| 2021/0167628 A1* | 6/2021 | Yoshida | H02J 7/0068 |

FOREIGN PATENT DOCUMENTS

| | | |
|---|---|---|
| CN | 206894129 U | 1/2018 |
| GB | 1 492 990 A | 11/1977 |
| JP | 6-141524 A | 5/1994 |
| JP | 5611565 B2 | 10/2014 |
| KR | 10-1727252 B1 | 5/2017 |
| KR | 10-1798324 B1 | 11/2017 |
| KR | 10-1970213 B1 | 4/2019 |
| KR | 10-2019-0055639 A | 5/2019 |

OTHER PUBLICATIONS

Extended European Search Report dated Jun. 15, 2020 for the corresponding European Patent Application No. 20174376.2 (10 pages in English).

* cited by examiner

Energy transducing efficiency increases ⟷ Energy transducing efficiency decreases

| Width | 0.63mm | 1mm | 1.5mm | 2mm | 2.5mm | 3mm | 3.5mm | 4mm | 4.5mm |
|---|---|---|---|---|---|---|---|---|---|
| Resonant frequency (MHz) & Mode shape | 0.35532 | 0.35693 | 0.3591 | 0.36048 | 0.36198 | 0.36255 | 0.35546 | 0.35546 | 0.34555 |
| | 1.0512 | 1.0512 | 0.99351 | 0.75639 | 0.61797 | 1.1456 | 1.086 | 0.9971 | 0.5531 |
| | | | | 1.2057 | 1.1696 | | | 1.2146 | 1.2171 |

FIG. 8

METHOD AND APPARATUS THAT PROVIDES POWER GENERATED FROM EXTERNAL ENERGY SIGNAL

CROSS-REFERENCE TO RELATED APPLICATIONS

This application claims the benefit under 35 USC § 119(a) of Korean Patent Application No. 10-2019-0108345 filed on Sep. 2, 2019 in the Korean Intellectual Property Office, the entire disclosure of which is incorporated herein by reference for all purposes.

BACKGROUND

1. Field

The following description relates to a method and apparatus that provides power generated from an external energy signal.

2. Description of Related Art

Wireless power transmission is considered to be a method of providing power to a wireless sensor network implanted in a human body for real-time body condition and lifestyle monitoring, or body stimulation for treatment of various conditions.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a power providing device includes a first energy harvester element configured to generate power in response to an external energy signal being received, a connection switching element configured to switch a connection between the first energy harvester element and a second energy harvester element; and a first rectifier comprising one or more path switching elements configured to change a rectification path in response to the switching of the connection switching element, wherein the first rectifier is connected to the first energy harvester element to rectify the power generated by the first energy harvester element along the rectification path.

In response to the first energy harvester element being connected in series with one or more second energy harvester elements, the path switching element may form a series path with a second rectifier connected to one of the one or more second energy harvester elements.

In response to the first energy harvester element being connected in series between two or more second energy harvester elements by two or more connection switching elements, the path switching element may exclude the first rectifier from the rectification path.

In response to the first energy harvester element being disconnected from the second energy harvester element, the path switching element may form a parallel rectification path with respect to the second energy harvester element.

The connection switching element may be configured to connect the first energy harvester element in series with the second energy harvester element in response to a connection signal, and disconnect the first energy harvester element from the second energy harvester element in response to a disconnection signal.

The power providing device may be configured to switch the connection between the first energy harvester element and the second energy harvester element through the connection switching element based on a current output from the first rectifier.

In response to the current output from the first rectifier being less than a threshold current, the power providing device may be further configured to additionally connect one or more second harvester elements in series with the first energy harvester element with a plurality of connection switching elements.

The power providing device may be configured to monitor currents output from the first rectifier for respective connection states between the first energy harvester element and the one or more second harvester elements, and determine a connection state in which a highest current is output, among the respective connection states.

The power providing device may be configured to maintain the determined connection state while the power rectified by the first rectifier is provided to a load.

The power providing device may be configured to determine an array corresponding to a current value output from individual energy harvester elements through the first rectifier, and form a connection of a plurality of energy harvester elements using a plurality of connection switching elements based on the determined array.

The connection switching element may be configured as a non-volatile memory switch to maintain one of a connection state and a disconnection state between the first energy harvester element and the second energy harvester element based on a pre-stored switching state.

The power providing device may further include a load connected to an output of the first rectifier, wherein in response to a plurality of energy harvester elements being connected in series, the first rectifier rectifies power with a voltage applied to a first end of the plurality of energy harvester elements and a second end of the plurality of energy harvester elements, and provides the rectified power to the load.

The first energy harvester element and the second energy harvester element may be formed of a material that vibrates in response to the receiving of the external energy signal, and the first energy harvester element and the second energy harvester element have a same resonant frequency.

The first energy harvester element and the second energy harvester element may be disposed on a same plane and have reception axes parallel to each other.

The one or more path switching elements may include a plurality of diode elements disposed to form the rectification path.

The one or more path switching elements may include passive diode elements and transistor switches, wherein the passive diode elements and the transistor switches are configured to form the rectification path in response to an output voltage of the first rectifier being less than a threshold output, and the transistor switches exclude the passive diode elements and form the rectification path through on-off switching based on a current output from the first energy harvester element, in response to the output voltage of the first rectifier being greater than or equal to the threshold output.

The external energy signal may be a signal propagated while vibrating through a medium, and the first energy harvester element is configured to generate the power based on vibration induced in response to the receiving of the external energy signal.

In a general aspect, a poser providing device includes a plurality of energy harvester elements configured to generate power in response to an external energy signal being received, a plurality of connection switching elements configured to switch a connection between the plurality of energy harvester elements; and a plurality of rectifiers individually connected to the plurality of energy harvester elements, wherein the plurality of rectifiers each include a path switching element configured to form a rectification path with respect to the power generated by the plurality of energy harvester elements in response to the switching of the plurality of connection switching elements.

In a general aspect, a power providing method performed by a power providing device includes generating, by a first energy harvester element, power in response to an external energy signal being received; switching a connection between the first energy harvester element and a second energy harvester element based on the generated power; forming a rectification path with respect to at least one of the first energy harvester element and the second energy harvester element in response to the switching; rectifying, by a rectifier, the power generated by the first energy harvester element along the rectification path; and maintaining the formed rectification path, while the power generated by the first energy harvester element and the second energy harvester element and rectified by the rectifier is provided to a load.

The forming of the rectification path may include additionally connecting the second energy harvester element to the first energy harvester element in series, in response to a current of the rectified power output from the rectifier being less than a threshold current.

In a general aspect, a power providing device includes a battery, a plurality of piezoelectric elements connected to the battery, the plurality of piezoelectric elements configured to generate power in response to a wireless signal being received, and provide the generated power to the battery; and a switching element configured to switch between a series connection mode and a parallel connection mode of the plurality of piezoelectric elements.

The wireless signal may be an ultrasonic signal.

The plurality of piezoelectric elements may include four or more piezoelectric elements.

A size of each of the plurality of piezoelectric elements may be less than or equal to 5 mm.

The series connection mode or the parallel connection mode of the plurality of piezoelectric elements may be determined based on a state of charge of the battery.

A rectifier may be connected to each of the plurality of piezoelectric elements.

The series connection mode or the parallel connection mode of the plurality of piezoelectric elements may be determined based on a current value output from the rectifier.

The power providing device may be configured to increase a number of piezoelectric elements connected in series, among the plurality of piezoelectric elements, with the switching element, in response to the current value output from the rectifier being less than a threshold current.

The switching element may be configured as a non-volatile memory switch to maintain one of the series connection mode and the parallel connection mode of the plurality of piezoelectric elements based on a pre-stored switching state.

The power providing device may be configured to maintain a connection state of the plurality of piezoelectric elements while power rectified by a rectifier is provided to the battery.

In a general aspect, a power providing system includes a transmitter configured to transmit an external energy signal, an bio-implant device configured to receive the transmitted external energy signal, and generate power based on the received external energy signal, wherein the bio-implant device may include a plurality of energy harvester elements connected in one of a series mode and a parallel mode, a rectifier; and a connection switching element configured to change arrays of the plurality of energy harvester elements in response to a current output from the rectifier being less than a threshold current.

The bio-implant device may be configured to monitor currents output from the rectifier for the respective changes in the arrays of energy harvester elements, and determine a connection state in which a highest current is output, among the respective arrays.

Other features and aspects will be apparent from the following detailed description, the drawings, and the claims.

BRIEF DESCRIPTION OF DRAWINGS

FIG. 8 illustrates an example of per-area characteristics of an energy harvester element, in accordance with one or more embodiments.

Figure 1:
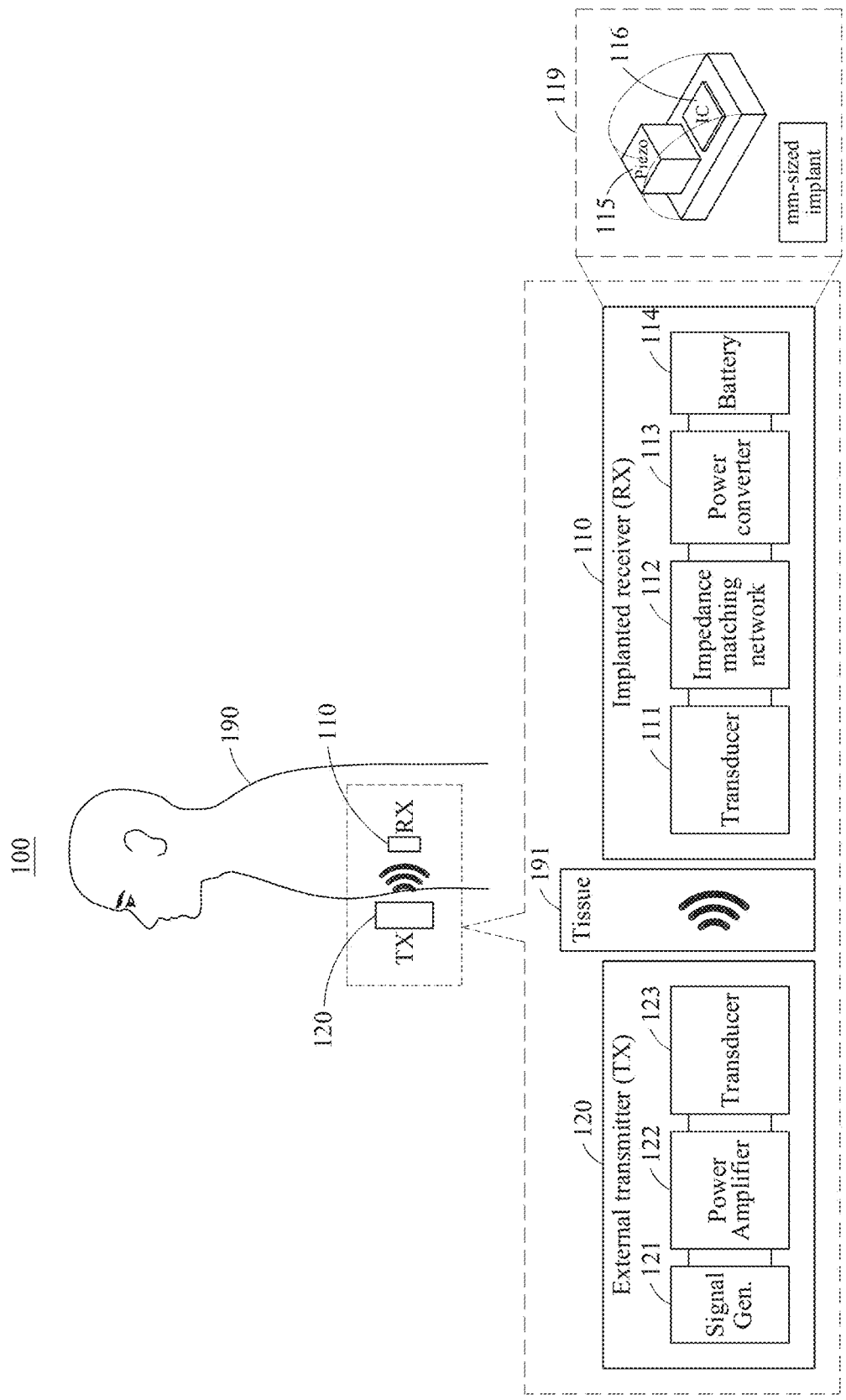
FIG. 1 illustrates an example of a power providing system, in accordance with one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms including technical and scientific terms used herein have the same meaning as commonly understood by one of ordinary skill in the art to which this disclosure pertains after an understanding of the present disclosure. It will be further understood that terms, such as those defined in commonly-used dictionaries, should be interpreted as having a meaning that is consistent with their meaning in the context of the relevant art and the present disclosure, and are not to be interpreted in an idealized or overly formal sense unless expressly so defined herein.

When describing the examples with reference to the accompanying drawings, like reference numerals refer to like constituent elements and a repeated description related thereto will be omitted. In the description of examples, a detailed description of well-known related structures or functions will be omitted when it is deemed that such description will cause ambiguous interpretation of the present disclosure.

FIG. 1 illustrates an example of a power providing system in accordance with one or more embodiments.

Referring to FIG. 1, a power providing system 100 includes an external transmitter 120 an internal receiver 110. The transmitter 120 includes a signal generator 121, a power amplifier 122, and a transducer 123. The receiver 110 may be implemented as a bio-implant device 119 that is implanted into a living body 190, for example, a human body, and includes a transducer 111, an impedance matching network 112, a power converter 113, and a battery 114. The receiver 110 receives an external energy signal transmitted from the transmitter 120, through a tissue 191 of the living body 190. For example, the transducer 111 of the receiver 110 may be implemented using a piezoelectric element 115, and the receiver 110 may be provided in a size of millimeters, for example, in a size less than or equal to 5 mm. The receiver 110 may be implanted into the human body to a depth greater than or equal to a predetermined distance, for example, 5 cm. The receiver 110 operates an integrated circuit (IC) 116 mounted therein by generating power based on the received external energy signal.

Hereinafter, the receiver 110 will be also referred to as a power providing device, in terms of providing power to a load.

Figure 2:
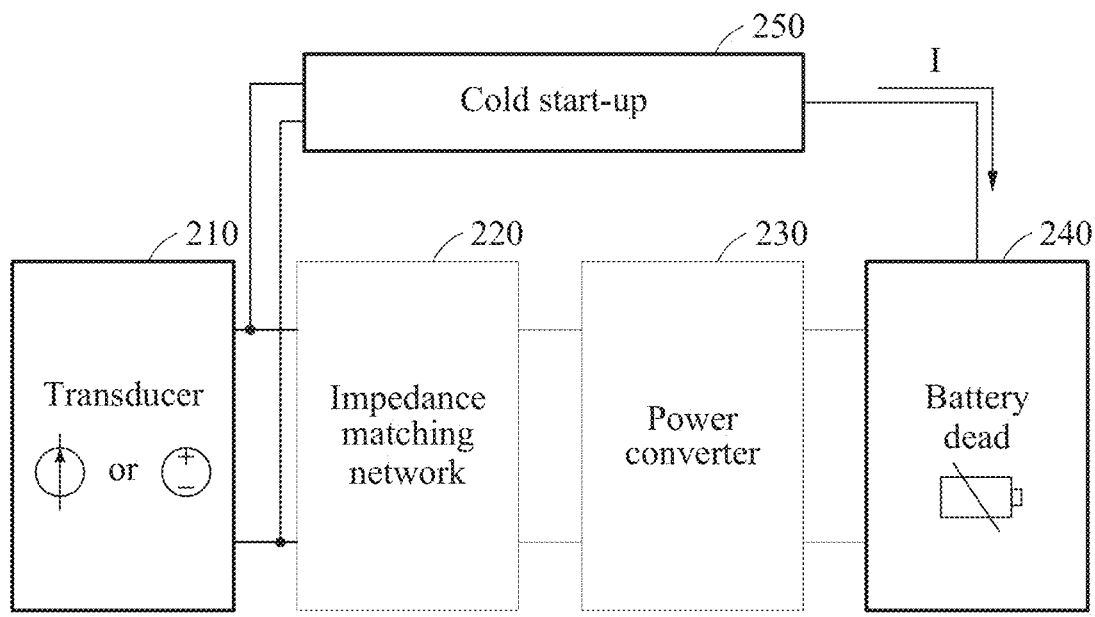
FIG. 2 illustrates an example of an operation of a power providing device, in accordance with one or more embodiments.

FIG. 2 illustrates an example of an operation of a power providing device 200.

Referring to FIG. 2, a power providing device 200 includes a transducer 210, an impedance matching network 220, a power converter 230, and a battery 240. The transducer 210 generates power in response to an external energy signal being received at the power providing device 200. The impedance matching network 220 is a circuit for impedance matching between the transducer 210 and the power converter 230. The power converter 230 converts power, for example, converts alternating current (AC) power to direct current (DC) power. If the battery 240 has insufficient power, the power providing device 200 converts power, generated by the transducer 210 in response to an external energy signal being received, to a relatively high efficiency, when compared to a cold start-up situation which will be described later, and provides the converted power to the battery 240.

The power providing device 200 further includes a cold start-up circuit 250. The cold start-up circuit 250 is a circuit that is activated in response to external power being received, even in a situation in which power for self-operation of the power providing device 200 is insufficient. For example, the cold start-up circuit 250 is a circuit configured to transmit power generated by the transducer 210 to the battery 240, in response to a state of charge of the battery 240 being less than a threshold state of charge. If the state of charge of the battery is less than the threshold state of charge, the impedance matching network 220 and the power converter 230 do not operate. In this example, the power providing device 200 converts the power generated by the transducer 210 to a relatively lower efficiency than usual, and provides the converted power to the battery 240. Thus, the power providing device 200 has a power conversion efficiency that varies based on the state of charge of the battery 240, and generates power at all times in response to external energy being received.

Hereinafter, a piezoelectric element as the transducer 210 will be described with reference to FIGS. 3 through 8, and a structure and an operation of a rectifier including the power converter 230 and the cold start-up circuit 250 implemented as an integral body will be described with reference to FIGS. 10 through 19. Herein, the impedance matching network 220 is omitted for ease of description. However, the impedance matching network 220 may be connected between the piezoelectric element and the rectifier.

Figure 3:
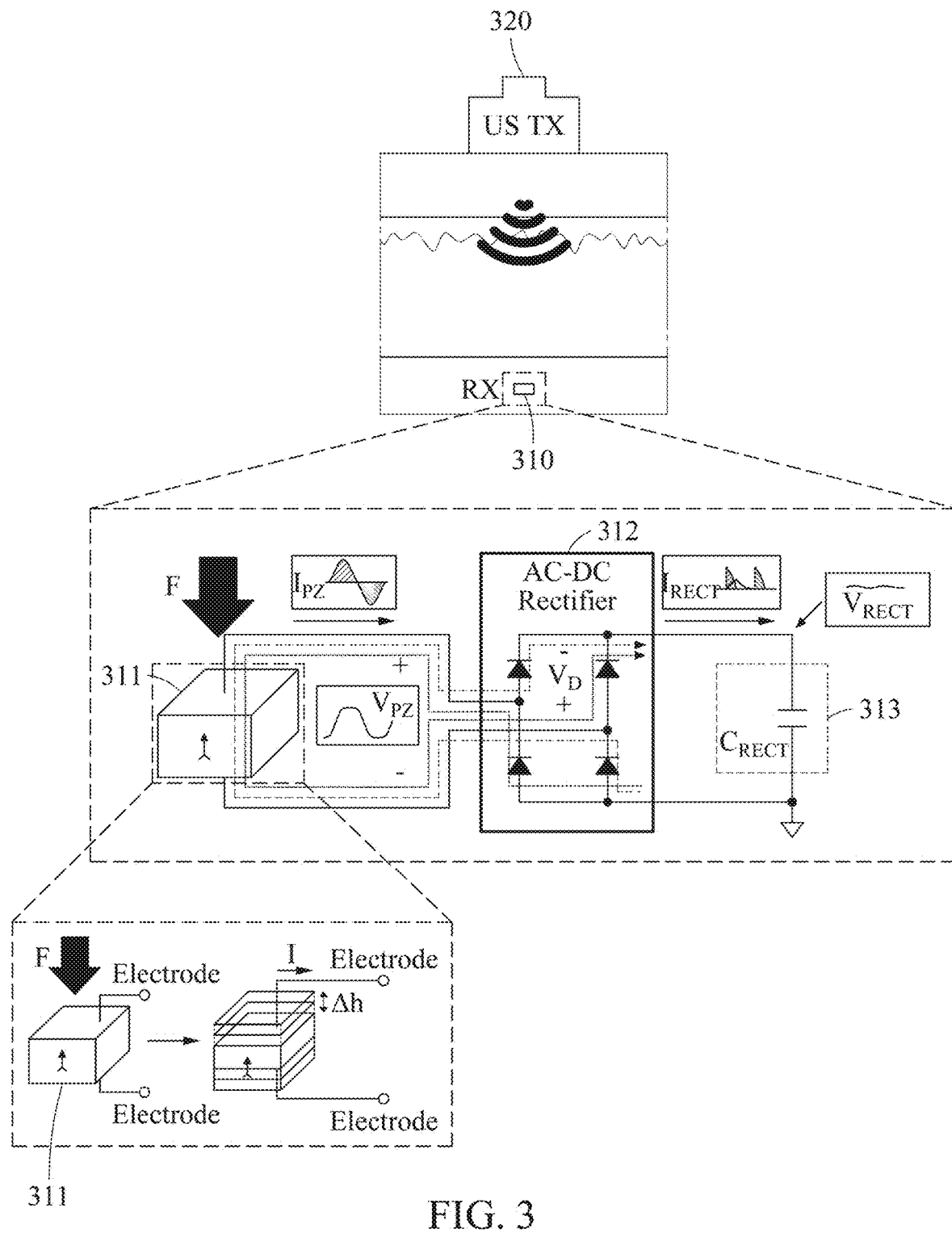
FIGS. 3 and 4 illustrate an example of an operation principle of an energy harvester element and a switching operation of a rectifier, in accordance with one or more embodiments.
Figure 4:
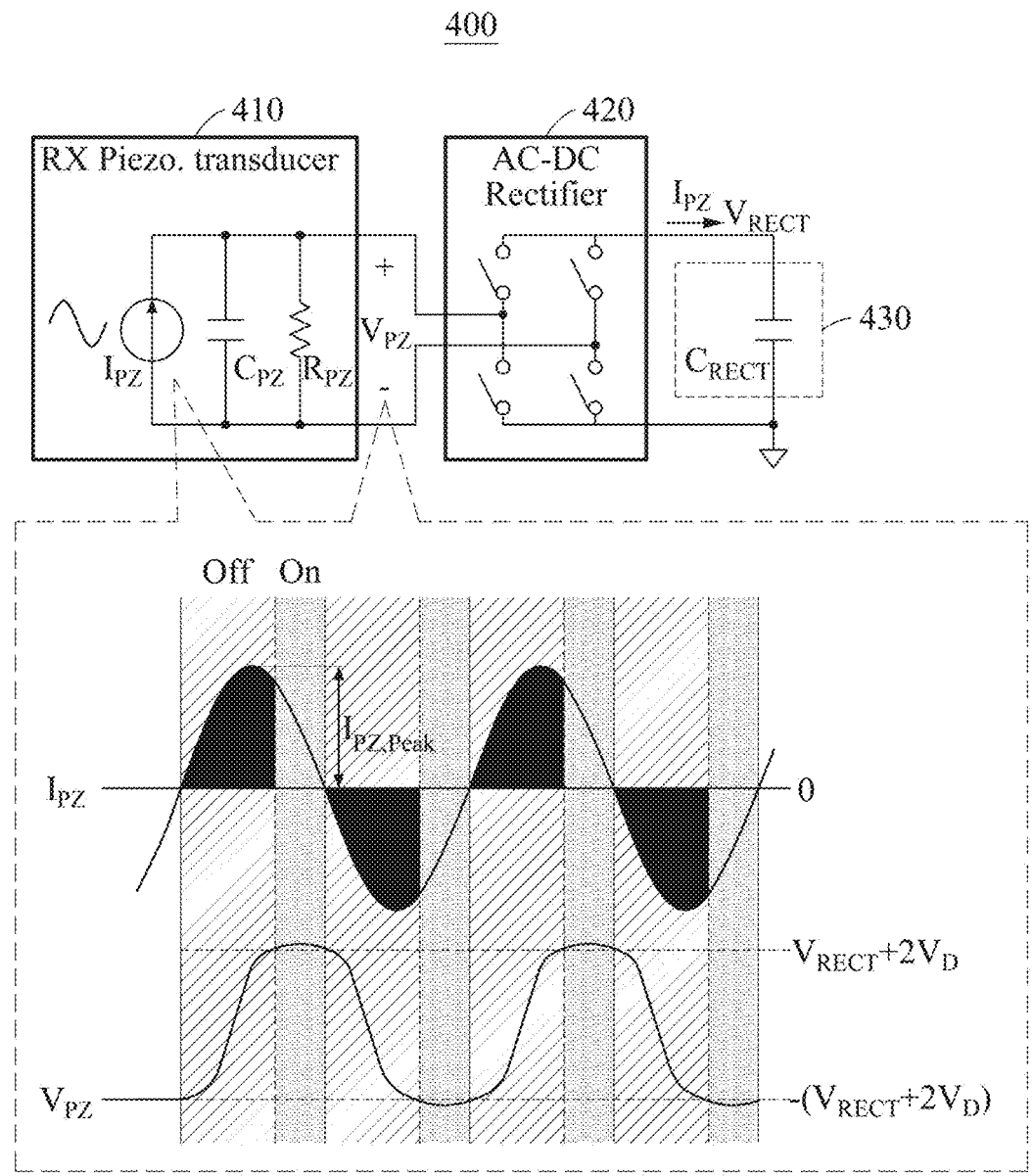

FIGS. 3 and 4 illustrate an example of an operation principle of an energy harvester element and a switching operation of a rectifier.

Referring to FIG. 3, a power transmitter 320 transmits an external energy signal to a power providing device 310. The external energy signal is a signal propagated while vibrating through a medium. For example, the power transmitter 320 transmits an ultrasonic signal vibrating at a predetermined frequency, as the external energy signal. An energy harvester element 311 of the power providing device 310 generates power based on vibration induced in response to the external energy signal being received, and is configured as a piezoelectric element. The power generated by the energy harvester element 311 is an AC waveform, and the AC waveform has a current $I_{PZ}$ and a voltage $V_{PZ}$. A rectifier 312 rectifies the power generated by the energy harvester element 311 from AC to DC. The power rectified by the rectifier 312 exhibits a current of $I_{RECT}$ and a voltage of $V_{RECT}$. The power with the current of $I_{RECT}$ and the voltage of $V_{RECT}$ is provided to a load 313 connected to the rectifier 312. In FIG. 3, the load 313 is a battery and is modeled as a capacitor $C_{RECT}$.

For reference, if the rectifier 312 includes passive diode elements, a threshold voltage of the passive diode elements is expressed as $V_D$. The passive diode elements are disposed to form a rectification circuit, and constitute a bridge circuit, for example. For example, in response to input of the power generated by the energy harvester element 311, the rectifier 312 forms a rectification path passing through two of the four passive diode elements. Thus, to operate the rectifier 312, a voltage of an input terminal should be greater than a sum of a voltage of an output terminal and the threshold voltage by the two passive diode elements. A requirement for the rectifier 312 to rectify the power generated by the energy harvester element 311 is expressed by Equation 1 below.

$$V_{PZ} - 2V_D > V_{RECT} \quad \text{Equation 1:}$$

In Equation 1, $V_{PZ}$ denotes a voltage of the power output from the energy harvester element 311, that is, a voltage applied to the input terminal of the rectifier 312. $V_{RECT}$ denotes a voltage of the rectified power output from the rectifier 312, that is, a voltage applied to the load 313.

FIG. 4 illustrates an equivalent model of a piezoelectric element 410 as an energy harvester element of a power providing device 400. The piezoelectric element 410 is modeled with a current source $I_{PZ}$, a parasitic capacitor $C_{PZ}$, and a resistor $R_{PZ}$, as shown in FIG. 4. A current output from the current source $I_{PZ}$ is a sine wave. However, examples are not limited thereto. The current output from the current source $I_{PZ}$ may be other sinusoidal waves. A resistance value of the resistor $R_{PZ}$ in the piezoelectric element 410 is overly great and thus, ignorable. Thus, a peak maximum of the voltage $V_{PZ}$ output from the piezoelectric element 410 is expressed by Equation 2 below.

Equation 2:

$$V_{PZ,MAX} = \frac{I_{PZ,Peak}}{2\pi \cdot f_{PZ} \cdot C_{PZ}}$$

In Equation 2, $f_{PZ}$ denotes a resonant frequency of the piezoelectric element 410. In FIG. 4, a current output from the current source $I_{PZ}$ is expressed by Equation 3 below.

$$I_{PZ} = I_{PZ,Peak} \cdot \sin(2\pi \cdot f_{PZ} \cdot t) \quad \text{Equation 3:}$$

While the voltage $V_{PZ}$ output from the piezoelectric element 410 exceeds a first threshold voltage in a positive-waveform period, a rectifier 420 forms a first rectification path. As expressed by Equation 1, only when the output voltage $V_{PZ}$ of the piezoelectric element 410 is greater than the first threshold voltage, for example, $V_{RECT} + 2V_D$, the rectifier 420 activates, for example, turns on, path switching elements configured to form the first rectification path. If the voltage $V_{PZ}$ output from the piezoelectric element 410 is less than or equal to the first threshold voltage in the positive-waveform period, the rectifier 420 cancels the first rectification path. The rectifier 420 deactivates, for example, turns off, the path switching elements corresponding to the first rectification path. The path switching elements are configured as passive diode elements. However, examples are not limited thereto. The path switching elements may be configured as active transistor switches. Further, while the voltage $V_{PZ}$ output from the piezoelectric element 410 is less than a second threshold voltage in a negative-waveform period, the rectifier 420 forms a second rectification path. Only when the output voltage $V_{PZ}$ of the piezoelectric element 410 is less than the second threshold voltage, for example, $-(V_{RECT} + 2V_D)$, the rectifier 420 activates path switching elements configured to form the second rectification path. If the voltage $V_{PZ}$ output from the piezoelectric element 410 is greater than or equal to the second threshold voltage in the negative-waveform period, the rectifier 420 cancels the second rectification path. For example, the rectifier 420 deactivates the path switching elements corresponding to the second rectification path. The path switching elements will be described below with reference to FIG. 15.

Thus, the power providing device 400 provides DC power to a load 430 by alternately forming the first rectification path and the second rectification path of the rectifier with respect to the AC power output from the piezoelectric element 410.

Figure 5:
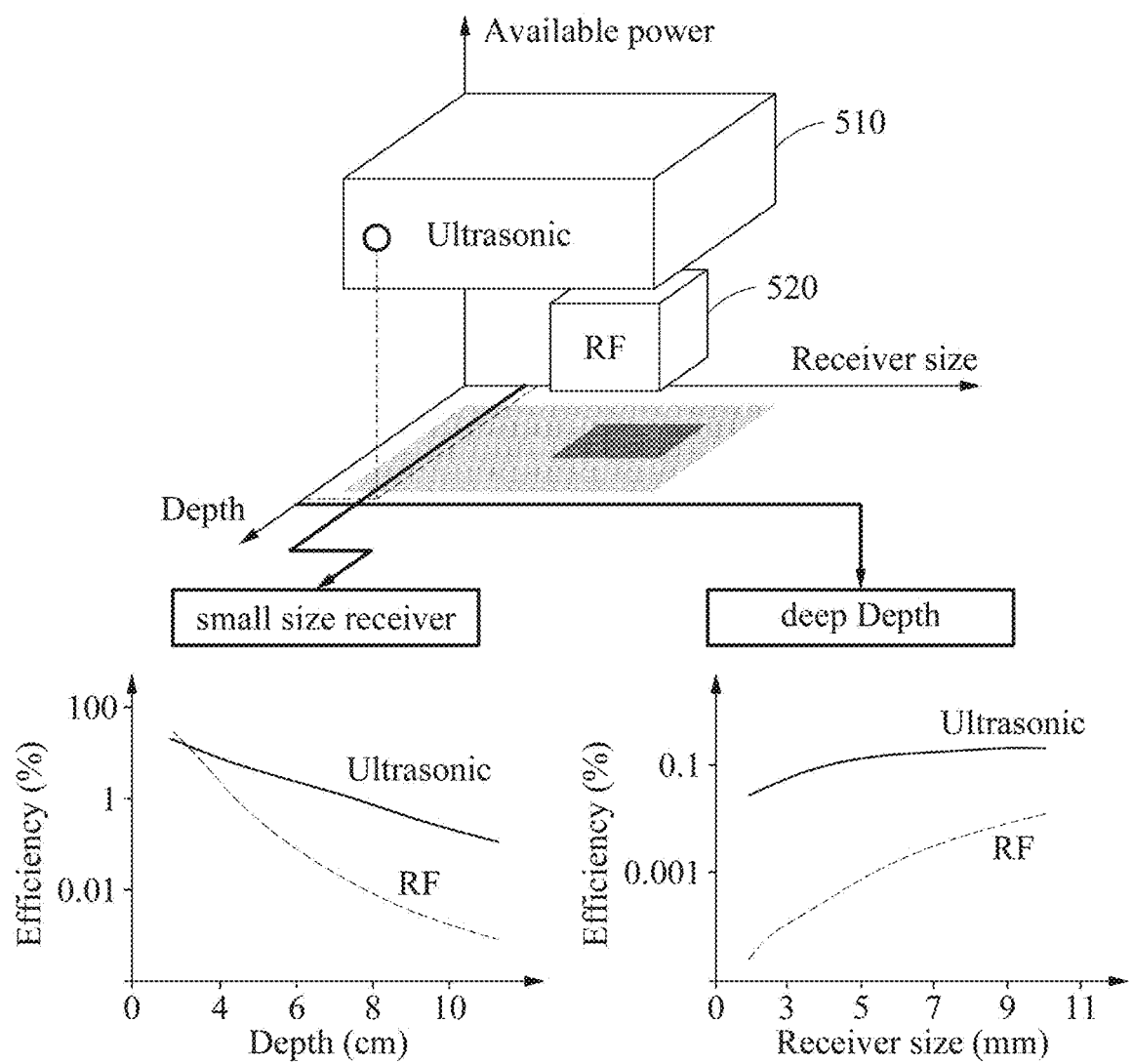
FIG. 5 illustrates an example of characteristics of an energy harvester element, in accordance with one or more embodiments.

FIG. 5 illustrates an example of characteristics of an energy harvester element, in accordance with one or more embodiments.

An external energy signal is implemented as an ultrasonic signal 510. However, examples are not limited thereto. The external energy signal may also be implemented as an electromagnetic signal 520, for example, an RF signal. As shown in FIG. 5, the ultrasonic signal 510 transmitted from a power transmitter induces power generation with respect to an energy harvester element with receiver size and insertion depth in a wider range than the electromagnetic signal 520. In the energy harvester element of the power providing device which has a small size, for example, a size of 5 mm, and which is inserted to a great depth, for example, a depth of 5 cm, the ultrasonic signal 510 exhibits a relatively high power transmission efficiency, when compared to the electromagnetic signal 520.

Thus, the energy harvester element using the ultrasonic signal 510 is implemented in a smaller size, for example, a size of less than or equal to 1 cm in diameter, and is advantageous for relatively long-range transmission, for example, power transmission at a distance of greater than or equal to 5 cm. The energy harvester element using the electromagnetic signal 520 is advantageous for short-range transmission, for example, power transmission at a distance of less than or equal to 3 cm.

Figure 6:
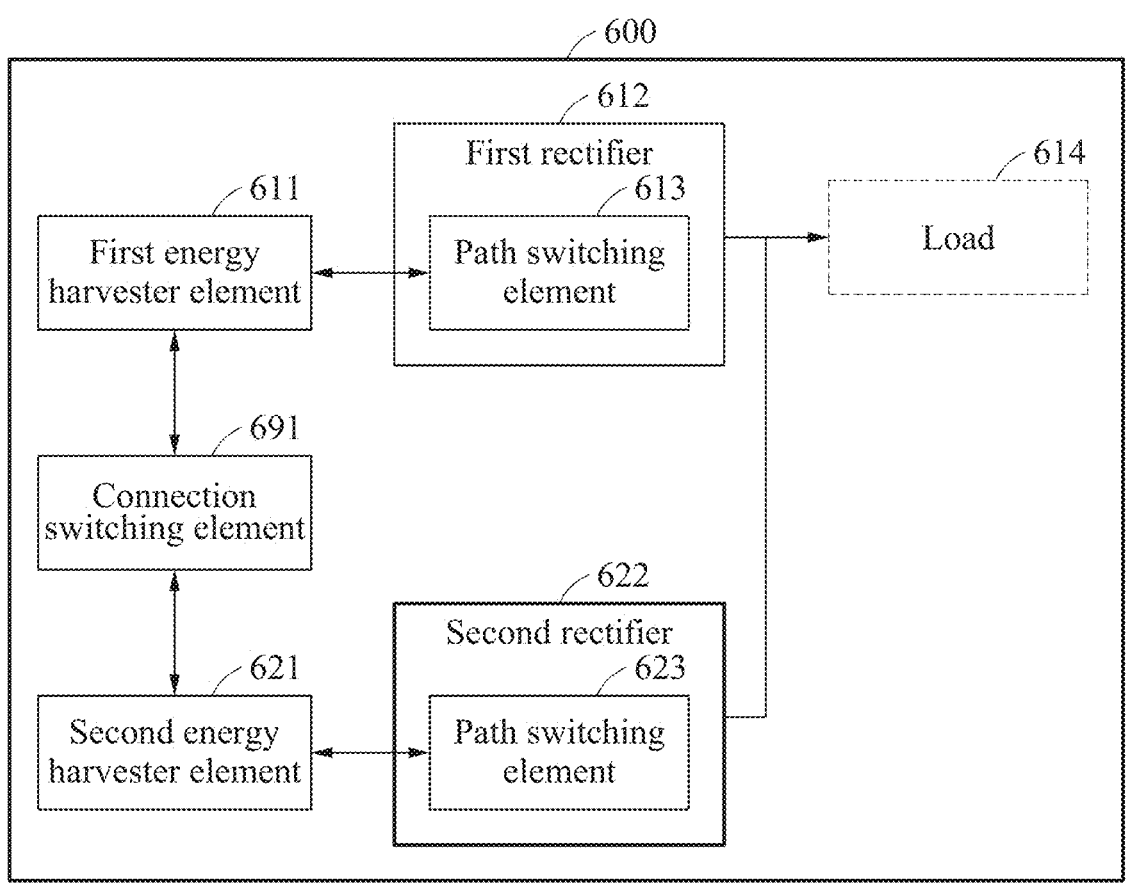
FIG. 6 illustrates an example of a configuration of a power providing device, in accordance with one or more embodiments.

FIG. 6 illustrates an example of a configuration of a power providing device, in accordance with one or more embodiments.

Referring to FIG. 6, a power providing device 600 includes a first energy harvester element 611, a first rectifier 612, a connection switching element 691, a second energy harvester element 621, a second rectifier 622, and a load 614. Although only a first and second energy harvester and the first and second rectifier are illustrated, this is only an example, and additional energy harvesters and rectifiers may be implemented based on the examples.

The first energy harvester element 611 generates power in response to an external energy signal being received.

The connection switching element 691 switches a connection between the first energy harvester element 611 and the second energy harvester element 621. The connection switching element 691 connects the first energy harvester element 611 and the second energy harvester element 621 in series in response to a connection signal. Further, the connection switching element 691 disconnects the first energy harvester element 611 from the second energy harvester element 621 in response to a disconnection signal. The connection switching element 691 may be configured as a complementary metal-oxide-semiconductor (CMOS) switch. However, examples are not limited thereto. The connection switching element 691 may also be configured as a non-volatile memory switch. In response to the switching of the connection switching element 691, an array of energy harvester elements and a rectification path of the first rectifier 612 corresponding to the array are determined. The array of the energy harvester elements is expressed by a×b, wherein a and b are each an integer greater than or equal to "1", and the product of a and b is less than or equal to N. "a" denotes the number of energy harvester elements connected in parallel, and "b" denotes the number of energy harvester elements connected in series.

The first rectifier 612 includes one or more path switches, and is connected to the first energy harvester element 611 to rectify the power generated by the first energy harvester element 611 along the rectification path. A path switching element 613 dynamically changes the rectification path in response to the switching of the connection switching element 691.

For example, in response to the first energy harvester element 611 being connected to one or more second energy harvester elements 621 in series, the path switching element 613 forms a series path with the second rectifier 622 connected to one of the one or more second energy harvester elements 621. In response to the first energy harvester element 611 being connected in series between second energy harvester elements by two or more connection switching elements 691, the path switching element 613 may exclude the first rectifier 612 from the rectification path. In response to the first energy harvester element 611 being disconnected from the second energy harvester element 621, the path switching element 613 forms a parallel rectification path with respect to the second energy harvester element 621. Examples of individual rectification paths formed by the path switching element 613 will be described below with reference to FIGS. 12 through 14.

The second energy harvester element 621 is connected to the second rectifier 622, and is connected to the first energy harvester element 611 through the connection switching element 691. The second rectifier 622 includes a path switching element 623. If the first energy harvester element 611 and the second energy harvester element 621 are connected in series through the connection switching element 691, the path switching elements 613 and 623 form a rectification path with respect to power generated by the two energy harvester elements 611 and 621.

In addition, the power providing device 600 further includes a controller. The connection signal and the disconnection signal applied to the connection switching element are generated by the controller. The controller applies one of the connection signal and the disconnection signal to each connection switching element based on at least one of a current output from an individual energy harvester element and a current output from a rectifier. If the path switching elements 613 and 623 are configured as on-off switches, the controller applies a signal to form a rectification path to an individual on-off switch depending on an array of energy harvester elements.

For reference, herein, on-switching refers to an operation of turning on, for example, activating a switch. Off-switching refers to an operation of turning off, for example, deactivating a switch.

For example, the first energy harvester element 611 is a piezoelectric element, and the load 614 is a battery. The power providing device 600 includes a plurality of piezoelectric elements, switching elements, for example, the connection switching element 691 and/or the path switching elements 613 and 623, and the first rectifier 612. The plurality of piezoelectric elements are connected to the battery or load 614 to generate power by receiving a wireless signal and provide the generated power to the battery 614. The power providing device 600 includes four or more piezoelectric elements. The size of each of the plurality of piezoelectric elements is less than or equal to 5 mm. However, examples are not limited thereto. The average length, for example, an average of height, width, and length, of each piezoelectric element is less than or equal to 5 mm. A switching element switches between a series connection and a parallel connection of the plurality of piezoelectric elements. The series connection or the parallel connection of the plurality of piezoelectric elements is determined based on a state of charge of the battery. The switching element is configured as a non-volatile memory switch, and maintains one of the series connection and the parallel connection of the plurality of piezoelectric elements based on a pre-stored switching state. For reference, the wireless signal is an ultrasonic signal.

Further, the first rectifier 612 of the power providing device 600 is connected to each of the plurality of piezoelectric elements. The series connection or the parallel connection of the plurality of piezoelectric elements is determined based on a current value output from the first rectifier 612. In response to the current value output from the first rectifier 612 being less than a threshold current, the power providing device 600 increases the number of piezoelectric elements connected in series, among the plurality of piezoelectric elements, using the switching element. While the power rectified by the first rectifier 612 is provided to the battery 614, the power providing device 600 maintains a connection state of the plurality of piezoelectric elements.

Figure 7:
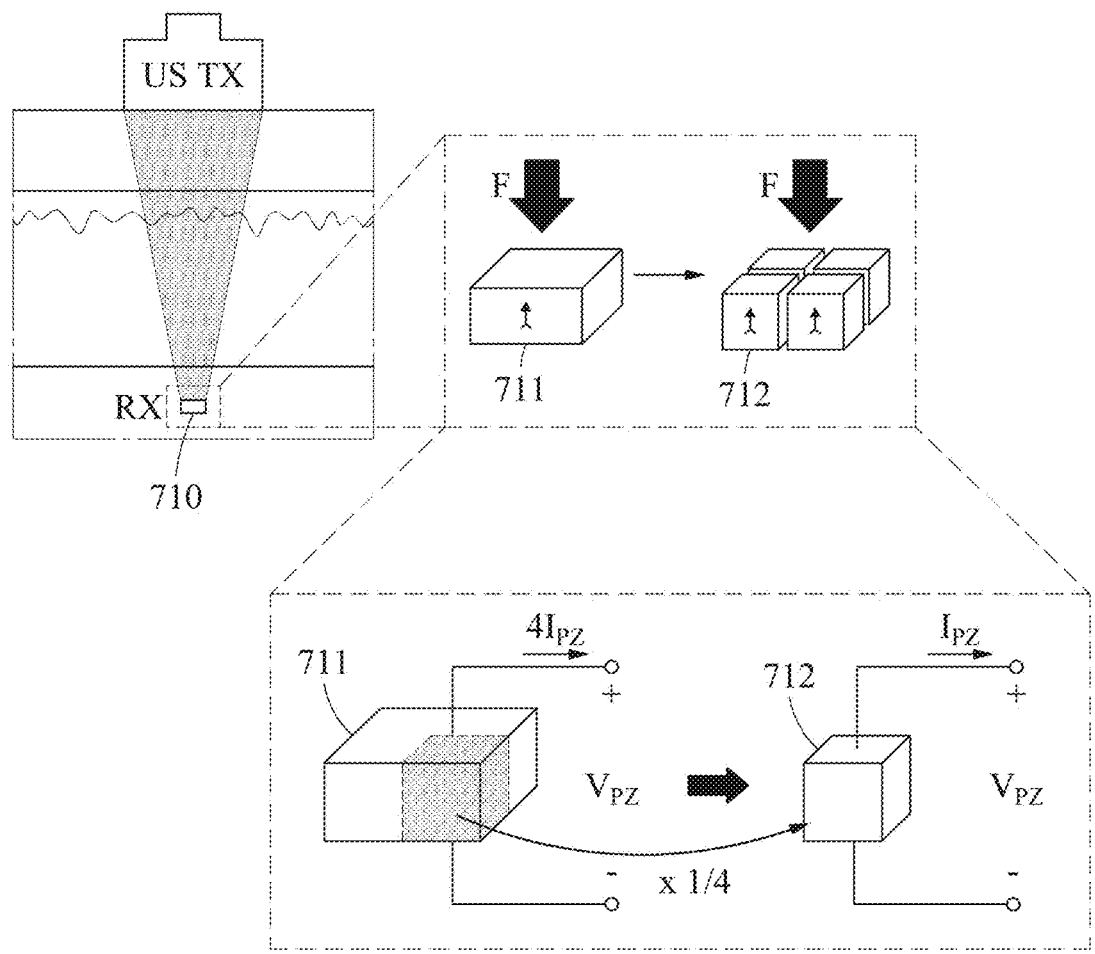
FIG. 7 illustrates an example of a configuration of an energy harvester element, in accordance with one or more embodiments.

FIG. 7 illustrates an example of a configuration of an energy harvester element.

A power providing device 710 includes a plurality of energy harvester elements, rather than a single energy harvester element 711. For example, through a structure that dynamically changes an array of a plurality of energy harvester elements within a limited form factor, the power providing device 710 receives an external energy signal more stably.

For example, FIG. 7 shows an example structure of a plurality of piezoelectric elements with the size divided into N, rather than a single piezoelectric element. A current $I_{PZ}$ and a voltage $V_{PZ}$ output from the piezoelectric elements change depending on an array of the plurality of piezoelectric elements. If a single piezoelectric element with a predetermined size is divided into N piezoelectric elements, a current $I_{PZ}$ output from an array of the N piezoelectric elements connected in series changes up to 1/N times, and a voltage $V_{PZ}$ output from the array of the N piezoelectric elements connected in series changes up to N times. N is an integer greater than or equal to "2". FIG. 7 is an example of N=4. Piezoelectric elements constituting an individual energy harvester element 712 are referred to as unit piezoelectric elements.

The power providing device 710 generates power in parallel by connecting each of a plurality of piezoelectric elements divided in a default array to an individual rectifier. If sufficient current is not output from the rectifier in a predetermined environment, the power providing device 710 increases the number of piezoelectric elements connected in series, thereby providing power more constantly. An example of changing the number of piezoelectric elements connected in series will be described below with reference to FIG. 9.

FIG. 8 illustrates an example of per-area characteristics of an energy harvester element, in accordance with one or more embodiments.

A first energy harvester element and a second energy harvester element are formed of a material which vibrates in response to an external energy signal being received, and may have the same resonant frequency. All energy harvester elements are configured to include the same material and have the same resonant frequency.

For example, if a piezoelectric element is formed of a material with a predetermined property, the piezoelectric element is designed with a height corresponding to a resonant frequency, for example, an ultrasonic resonant frequency. For example, piezoelectric elements with the same height have the same resonant frequency even when different in area. The area of a piezoelectric element is determined based on power to be harvested. As shown in FIG. 8, as the area of the piezoelectric element decreases, the energy transducing efficiency increases.

For reference, an optimal width and a maximum width for the height of a piezoelectric element are determined based on a vibration mode of the material of the piezoelectric element.

Figure 9:
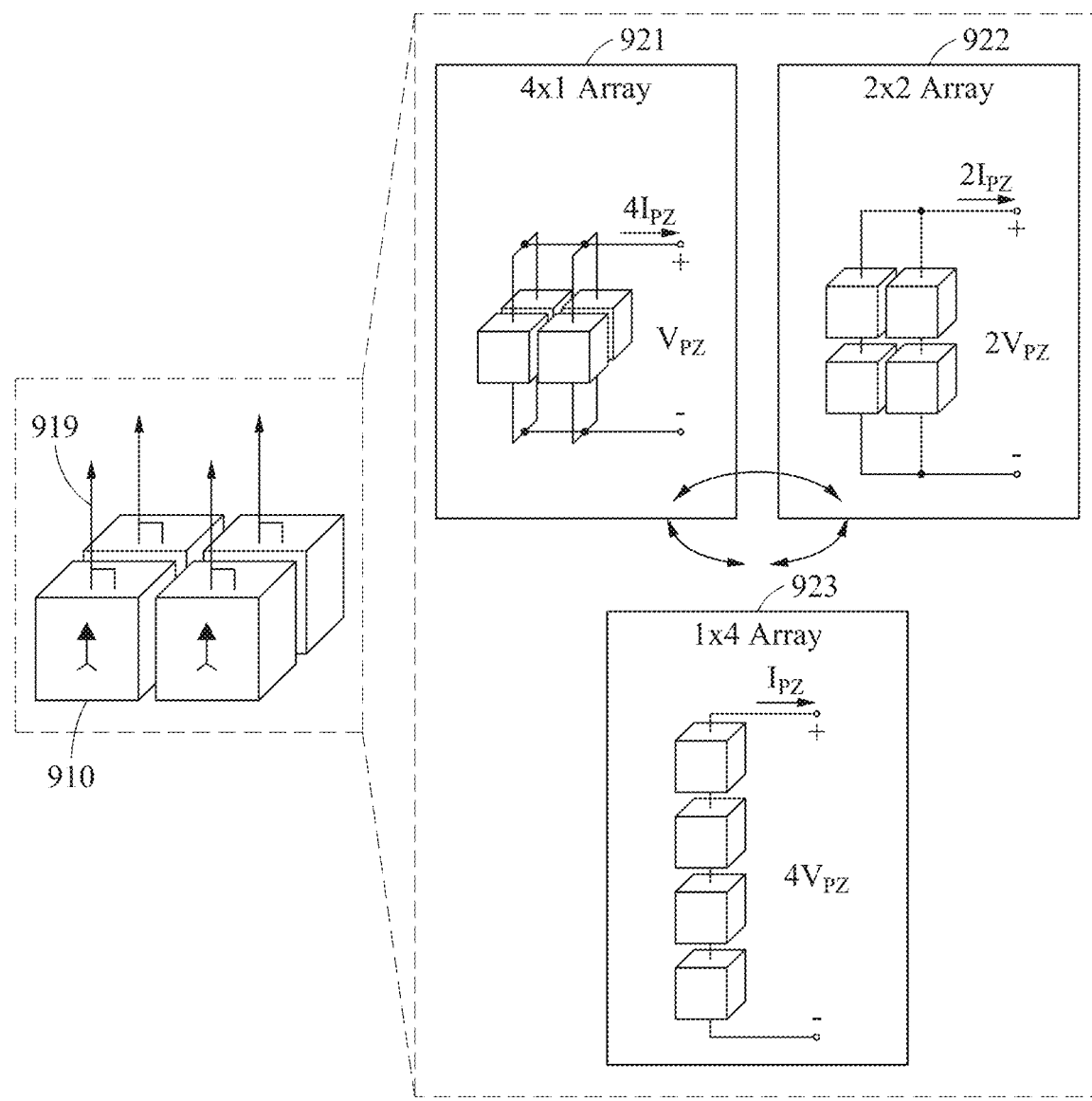
FIG. 9 illustrates an example of a relationship of a voltage and a current for a series connection and a parallel connection of energy harvester elements, in accordance with one or more embodiments.

FIG. 9 illustrates an example of a relationship of a voltage and a current for a series connection and a parallel connection of energy harvester elements, in accordance with one or more embodiments.

An implantable wireless power management integrated circuit (PMIC) is designed to generate power as stably as possible, even when an RX transducer, for example, an energy harvester element 910, positioned in a body is relocated to a predetermined position, or is rotated a predetermined angle. If an electrical path with respect to a single piezoelectric element is fixed, the energy transducing efficiency of the energy harvester element 910 decreases in response to a transmission axis misalignment between the energy harvester element 910 and a power transmitter. That is because in response to the transmission axis misalignment between the energy harvester element 910 and the power transmitter, a peak value $I_{Peak}$ of current output from the energy harvester element 910 decreases, and an output voltage decreases as the current decreases, and thus the rectifier at the rear end of the energy harvester element 910 is difficult to operate, as described in FIG. 4.

A power providing device adjusts a voltage and a current to be provided from a plurality of energy harvester elements to a rectifier, by changing an array of the energy harvester elements. FIG. 9 illustrates an example in which the power providing device includes four energy harvester elements. Further, the energy harvester element 910, and other energy harvester elements disposed in a proximate location to the energy harvester element 910, are disposed on the same plane and have reception axes 919 parallel to each other. Thus, the energy harvester element 910 and the other energy harvester elements disposed in a proximate location to the energy harvester element 910, generate power with the same current value or similar current values in response to an external energy signal being transferred while vibrating along the same transmission axis. However, examples are not limited thereto. The reception axes 919 of the energy harvester element 910 and the other energy harvester elements may be disposed differently, such that the energy harvester element 910 may generate power from an external energy signal received from a predetermined direction.

For example, four energy harvester elements are connected to each other in parallel in a first array 921. As described above, the energy harvester elements are modeled as current sources that generate power of the same current value. Assuming that an individual energy harvester element 910 outputs a current of $I_{PZ}$ and a voltage of $V_{PZ}$, the first array 921 outputs a current of $4I_{PZ}$ and a voltage of $V_{PZ}$. Since two energy harvester elements are connected in series in a second array 922, the second array 922 outputs a voltage of $2V_{PZ}$. Since two energy harvester elements are connected in parallel in the second array 922, the second array 922 outputs a current of $2I_{PZ}$. Since four energy harvester elements are connected in series in a third array 923, the third array 923 outputs a voltage of $4V_{PZ}$ and a current of $I_{PZ}$. For reference, FIG. 9 illustrates the energy harvester element 910 and the other energy harvester elements disposed at different positions for a series connection and a parallel connection, for descriptive purposes. However, in a real implementation, the physical positions of the energy harvester element 910 and the other energy harvester elements may be fixed, rather than changing. In this example, only an electrical connection between energy harvester elements may be controlled.

Figure 10:
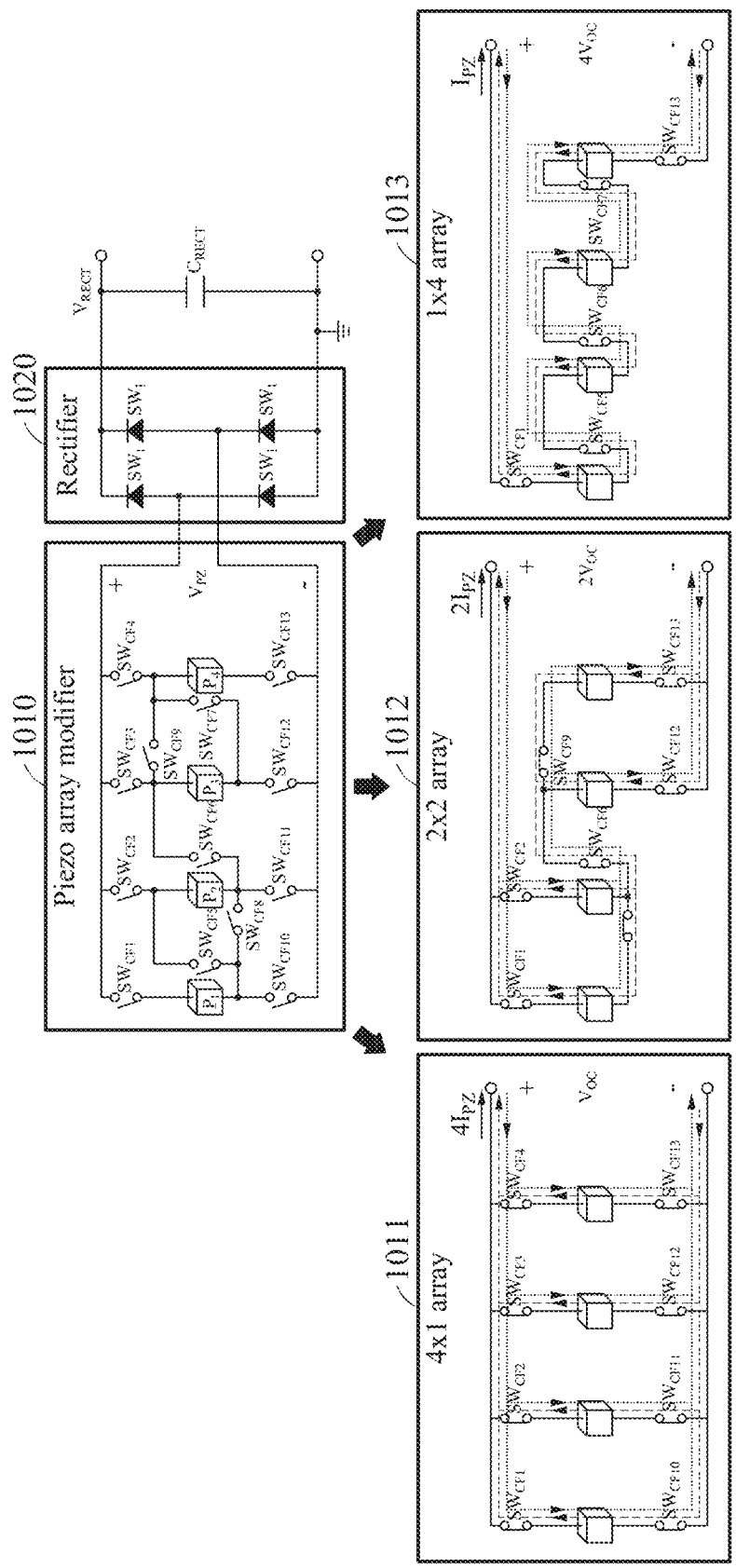
FIG. 10 illustrates an example of an array of energy harvester elements, in accordance with one or more embodiments.

FIG. 10 illustrates an example of an array of energy harvester elements, in accordance with one or more embodiments.

A plurality of energy harvester elements 1010 are connected through a plurality of connection switching elements $SW_{CF1}$ through $SW_{CF13}$. In the example of FIG. 10, thirteen connection switching elements $SW_{CF1}$ through $SW_{CF13}$ may be connected to four energy harvester elements 1010. The plurality of connection switching elements switch between a series connection and a parallel connection of the plurality of energy harvester elements 1010. A controller individually applies a connection signal or a disconnection signal to each of the plurality of connection switches, and the plurality of energy harvester elements 1010 may operate as one of the arrays shown in FIG. 9. A rectifier 1020 rectifies power generated by the plurality of energy harvester elements 1010 forming a predetermined array. The connection switching elements $SW_{CF1}$ through $SW_{CF13}$ include connection switches $SW_{CF1}$ through $SW_{CF4}$ and $SW_{CF10}$ through $SW_{CF13}$ configured to connect an individual energy harvester element to the rectifier 1020, connection switches $SW_{CF5}$, $SW_{CF6}$, and $SW_{CF7}$ configured to connect the energy harvester elements 1010 in series, and connection switches $SW_{CF8}$ and $SW_{CF9}$ configured to connect the energy harvester elements 1010 in parallel.

In a first array 1011, the plurality of energy harvester elements 1010 are connected to each other in parallel, and individually provides power to the rectifier 1020. Thus, the connection switches $SW_{CF1}$ through $SW_{CF4}$ and $SW_{CF10}$ through $SW_{CF13}$ are turned on in response to the connection signal from the controller. As described with reference to FIG. 9, in the first array 1011, a sum of currents output from the individual energy harvester elements 1010 ($4I_{PZ}$ in FIG. 10) and an individual voltage $V_{OC}$ are output to the rectifier 1020.

In a second array 1012, the energy harvester elements 1010 are connected in parallel two by two. Further, two of the energy harvester elements 1010 are connected in series along a rectification path formed with respect to the rectifier 1020. Thus, the connection switches $SW_{CF1}$, $SW_{CF2}$, $SW_{CF12}$, and $SW_{CF13}$, the connection switches $SW_{CF8}$ and $SW_{CF9}$ for parallel connection, and the connection switch $SW_{CF6}$ for series connection are turned on in response to the signal from the controller. As described with reference to FIG. 9, in the second array 1012, a sum of currents output from the two energy harvester elements 1010 connected in parallel ($2I_{PZ}$ in FIG. 10) and a sum of voltages output from the two energy harvester elements 1010 connected in series ($2V_{OC}$ in FIG. 10) are output to the rectifier 1020.

In a third array 1013, the four energy harvester elements 1010 are all connected in series. Thus, the connection switches $SW_{CF1}$ and $SW_{CF13}$ connected to both ends of the energy harvester elements 1010 connected in series, and the connection switches $SW_{CF5}$, $SW_{CF6}$, and $SW_{CF7}$ for series connection are turned on in response to the signal from the controller. As described with reference to FIG. 9, in the third array 1013, a sum of voltages output from the four energy harvester elements 1010 connected in series ($4V_{OC}$ in FIG. 10) is output to the rectifier 1020.

As described above, the series connection and the parallel connection of the plurality of energy harvester elements are switched in response to the connection switching elements being activated and deactivated, and the number of energy harvester elements connected in series and the number of energy harvester elements connected in parallel, among the plurality of energy harvester elements, are adjusted. When the array of the plurality of energy harvester elements changes, an electrical path along which the generated power is provided to the rectifier also changes. When the array of the energy harvester elements changes, the ratio of current and voltage output to the rectifier is adjusted. Thus, despite an angle alignment error occurring between a transmission axis of a power transmitter and a reception axis of a power providing device, the power providing device continuously operates the rectifier 1020, thereby stably generating power in response to an external energy signal being received.

However, the configuration of the connection switching element is not limited thereto. Hereinafter, a circuit structure for generating power in response to an external energy signal being received, even in an environment not including a battery as a load or in an environment in which the battery is fully discharged, will be described through another configuration of the connection switching element.

Figure 11:
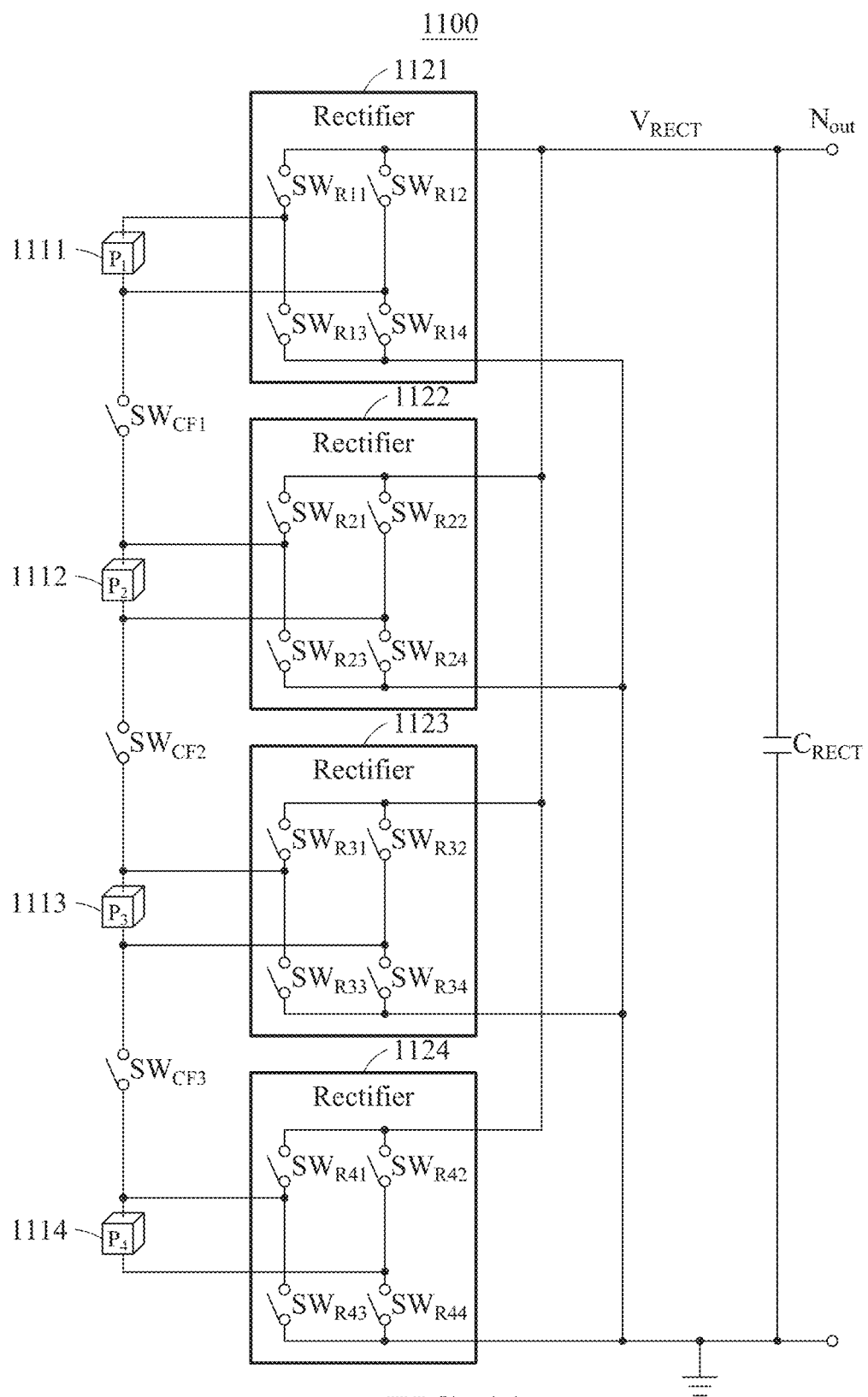
FIG. 11 illustrates an example of a circuit diagram of a power providing device, in accordance with one or more embodiments.

FIG. 11 illustrates an example of a circuit diagram of a power providing device, in accordance with one or more embodiments.

Referring to FIG. 11, a power providing device 1100 includes a plurality of energy harvester elements 1111, 1112, 1113, and 1114, a plurality of rectifiers 1121, 1122, 1123, and 1124, and a plurality of connection switching elements $SW_{CF1}$, $SW_{CF2}$, and $SW_{CF3}$. The plurality of connection switching elements $SW_{CF1}$, $SW_{CF2}$, and $SW_{CF3}$ are connected between the plurality of energy harvester elements 1111, 1112, 1113, and 1114. For example, if the power providing device 1100 includes N energy harvester elements 1111, 1112, 1113, and 1114, the power providing device 1100 includes N−1 connection switching elements $SW_{CF1}$, $SW_{CF2}$, and $SW_{CF3}$. A rectifier is connected to an output of each of the plurality of energy harvester elements 1111, 1112, 1113, and 1114. For example, if the power providing device 1100 includes N energy harvester elements 1111, 1112, 1113, and 114, the power providing device 1100 includes N rectifiers 1121, 1122, 1123, and 1124. For reference, FIG. 11 illustrates the plurality of energy harvester elements 1111, 1112, 1113, and 1114 disposed in a row for ease of description. However, the implemented arrangement is not limited thereto. The plurality of energy harvester elements 1111, 1112, 1113, and 1114 may be disposed on a predetermined plane as described with reference to FIG. 9, or may be disposed in other manners.

The rectifiers include a plurality of path switching elements $SW_{R11}$ through $SW_{R44}$ to form a rectification path. For example, the rectifiers each include four path switching elements. The four path switching elements include a first path switch and a fourth path switch to be activated in a period in which a voltage of power generated by the energy harvester elements represents a positive waveform, and a second path switch and a third path switch to be activated in a period in which the voltage of power generated by the energy harvester elements represents a negative waveform. The first path switch and the fourth path switch, and the second path switch and the third path switch constitute a rectification circuit, for example, a bridge circuit structure. The rectification path formed by the first path switch and the fourth path switch, and the second path switch and the third path switch being activated and/or deactivated in response to the switching of the connection switching elements will be described with reference to FIGS. 12 through 14.

In FIG. 11, the first energy harvester element 1111 is connected to the first rectifier 1121. The first rectifier 1121 includes four path switching elements $SW_{R11}$, $SW_{R12}$, $SW_{R13}$, and $SW_{R14}$. The first path switch $SW_{R11}$ and the fourth path switch $SW_{R14}$ are activated in a period in which a voltage of power generated by the first energy harvester element 1111 represents a positive waveform, and the second path switch $SW_{R12}$ and the third path switch $SW_{R13}$ are activated in a period in which the voltage of power generated by the first energy harvester element 1111 represents a negative waveform. The first connection switching element $SW_{CF1}$ is connected between the first energy harvester element 1111 and the second energy harvester element 1112. The second energy harvester element 1112 is connected to the second rectifier 1122, and the second rectifier 1122 includes four path switching elements $SW_{R21}$, $SW_{R22}$, $SW_{R23}$, and $SW_{R24}$. The second connection switching element $SW_{CF2}$ is connected between the second energy harvester element 1112 and the third energy harvester element 1113. The third energy harvester element 1113 is connected to the third rectifier 1123, and the third rectifier 1123 includes four path switching elements $SW_{R31}$, $SW_{R32}$, $SW_{R33}$, and $SW_{R34}$. The third connection switching element $SW_{CF3}$ is connected between the third energy harvester element 1113 and the fourth energy harvester element 1114. The fourth energy harvester element 1114 is connected to the fourth rectifier 1124, and the fourth rectifier 1124 includes four path switching elements $SW_{R41}$, $SW_{R42}$, $SW_{R43}$, and $SW_{R44}$.

Outputs of the rectifiers 1121, 1122, 1123, and 1124 are connected to the same output node $N_{out}$. In FIG. 11, as a load, a capacitor $C_{RECT}$ is connected to the output node $N_{out}$.

Further, the connection switching elements $SW_{CF1}$, $SW_{CF2}$, and $SW_{CF3}$ are configured as non-volatile memory switches to maintain one of a connection and a disconnection between a first energy harvester element and a second energy harvester element based on a pre-stored switching state. Thus, even when an external energy signal is received while a battery is not provided or a state of charge is less than a threshold state of charge, the power providing device 1100 connects the energy harvester elements 1111, 1112, 1113, and 1114 as a default array using the non-volatile memory switches. The default array changes based on the connection state of the non-volatile memory switches. For example, if four energy harvester elements 1111, 1112, 1113, and 1114 are provided as in FIG. 11, the power providing device 1100 designates one of 4×1, 2×2, and 1×4 arrays as the default array, using the non-volatile memory switches. The power providing device 1100 performs a cold start-up function in one of various default arrays, for example, the 4×1, 2×2, and 1×4 arrays. Based on the number of the energy harvester elements 1111, 1112, 1113, and 1114 connected in series in the default array, the lowest current and the lowest voltage of power to be generated by individual energy harvesters to perform the cold start-up are changed.

For reference, if the connection switching elements $SW_{CF1}$, $SW_{CF2}$, and $SW_{CF3}$ are configured as CMOS switches, instead of the non-volatile memory switches, the CMOS switches are all turned off if no power is provided. Thus, the default array is an array (for example, the 4×1 array) including the individual energy harvester elements connected in parallel. In this example, if an angle of error between a reception axis of an individual energy harvester element and a transmission axis of a power transmitter is less than a threshold angle, the individual energy harvester element satisfies the condition according to Equation 1. Thus, even when the energy harvester elements 1111, 1112, 1113, and 1114 are all connected in parallel, the power providing device 1100 performs the cold start-up function.

In an aspect of a circuit, the total area occupied by the four rectifiers of FIG. 11 in the circuit is substantially the same as the area occupied by the single rectifier of FIG. 10. That is because the die areas are the same. Since the area required for circuit implementation does not increase, the unit cost of production does not change. The single rectifier 1020 of FIG. 10 receives currents (for example, $N \times I_{PZ}$) in parallel from up to N piezoelectric elements. Thus, the size of four switches SW1 through SW4 constituting the single rectifier increases. Conversely, an individual rectifier of FIG. 11 receives a current (for example, $I_{PZ}$) from a single piezoelectric element. Thus, the size of four switches constituting the individual rectifier, for example, $SW_{R1}$ through $SW_{R14}$ in a case of the first rectifier, decreases to 1/N, when compared to the example of FIG. 11. Such size reduction leads to a reduction in the range of trimming of the individual rectifier. The total area occupied by the N rectifiers 1121 through 1124 of FIG. 11 is substantially the same as the area occupied by the single rectifier 1020 of FIG. 10.

Furthermore, the individual rectifiers may be configured as passive diode elements in the structure of FIG. 11. Thus, even when a battery embedded in the power providing device 1100 or a state of charge is insufficient, an input voltage for the rectifier is generated in response to an external energy signal. After a predetermined or higher input voltage is formed, the power providing device 1100 changes a series connection and a parallel connection of the piezoelectric elements.

An array including the energy harvester elements 1111, 1112, 1113, and 1114 all connected in parallel is mainly described below as a default array. For example, the plurality of connection switching elements $SW_{CF1}$, $SW_{CF2}$, and $SW_{CF3}$ may be configured as CMOS switches. In another example, for an array including the energy harvester elements 1111, 1112, 1113, and 1114 all connected in parallel, if the plurality of connection switching elements $SW_{CF1}$, $SW_{CF2}$, and $SW_{CF3}$ are configured as non-volatile memory switches, the pre-stored switching state is set as a disconnection state for each non-volatile memory switch. However, the default array is not limited to the array including the energy harvester elements 1111, 1112, 1113, and 1114 all connected in parallel. If the plurality of connection switching elements $SW_{CF1}$, $SW_{CF2}$, and $SW_{CF3}$ are configured as non-volatile memory switches, the default array may be designated as various arrays, for example, a 4×1 array, a 2×2 array, and a 1×4 array.

Figure 12:
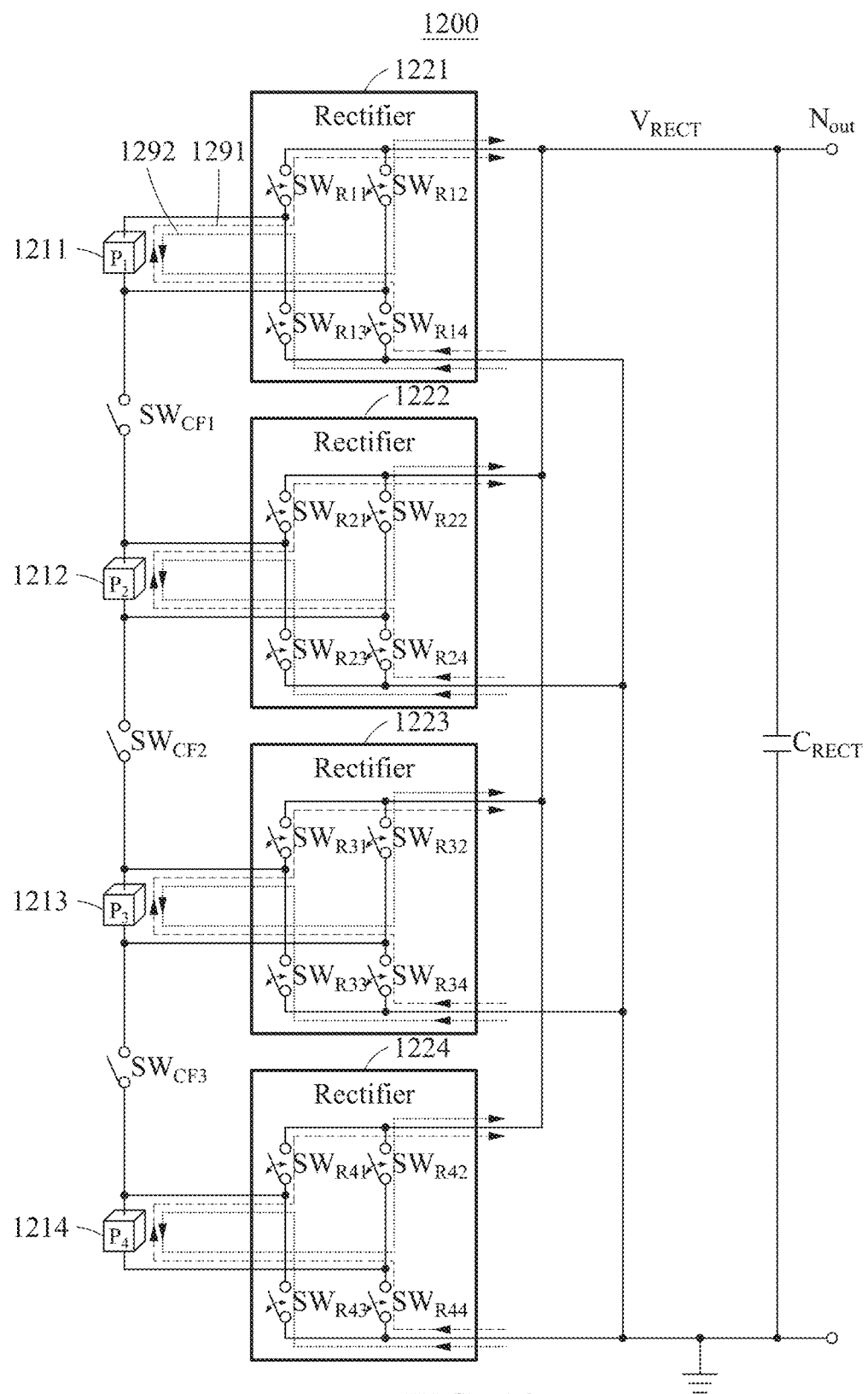
FIGS. 12 through 14 illustrate examples of rectification paths for arrays of power providing devices, in accordance with one or more embodiments.
Figure 13:
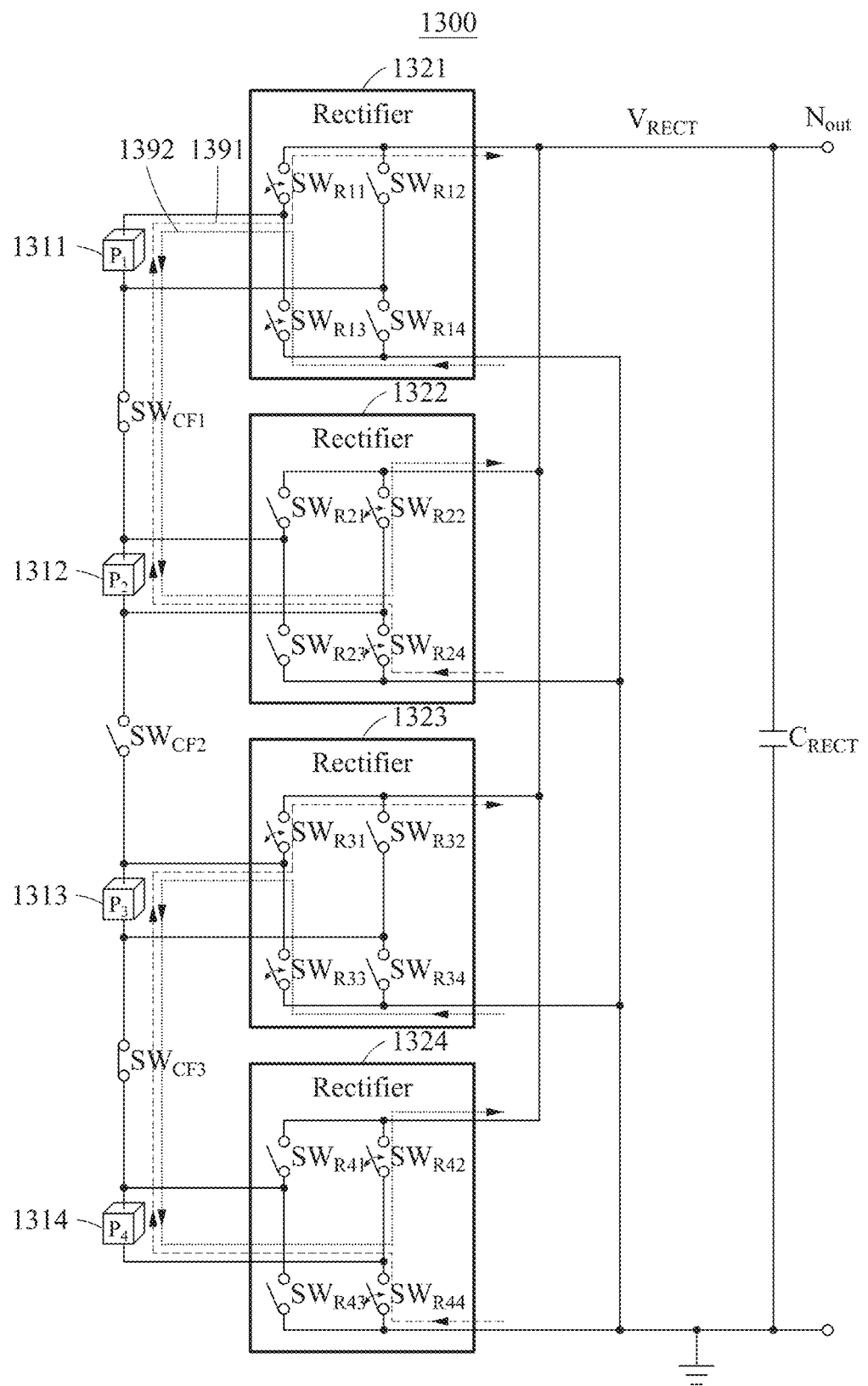
Figure 14:
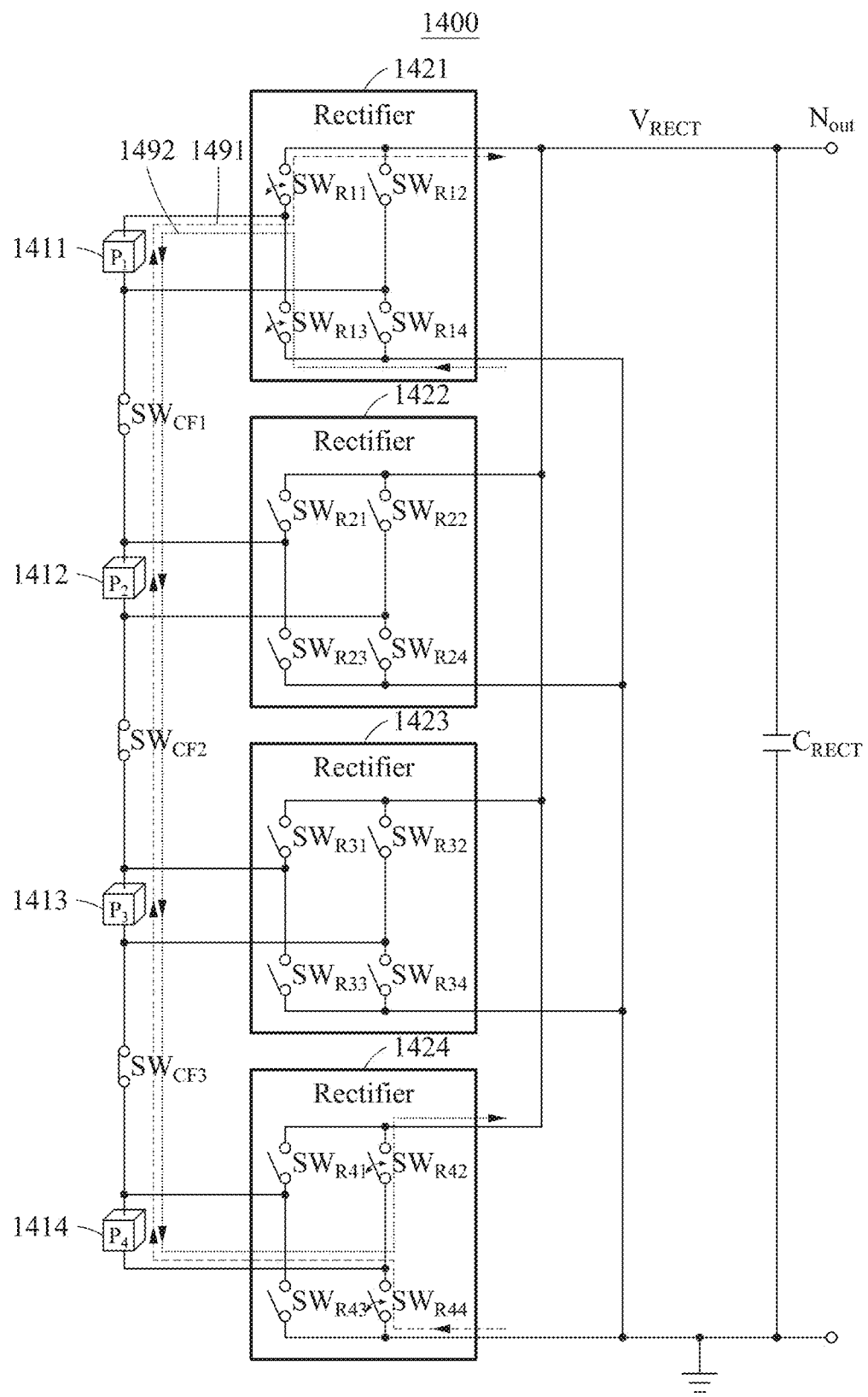

FIGS. 12 through 14 illustrate examples of rectification paths for arrays of power providing devices.

FIG. 12 illustrates an array including a plurality of energy harvester elements 1211, 1212, 1213, and 1214 all independently connected in parallel. N energy harvester elements 1211, 1212, 1213, and 1214 are connected to each other in parallel. A plurality of connection switching elements $SW_{CF1}$, $SW_{CF2}$, and $SW_{CF3}$ are all turned off.

The N energy harvester elements 1211, 1212, 1213, and 1214 transfer generated power respectively to rectifiers 1221, 1222, 1223, and 1224. For example, the first energy harvester element 1211, the second energy harvester 1212, the third energy harvester element 1213, and the fourth energy harvester element 1214 transfer power to the first rectifier 1221, the second rectifier 1222, the third rectifier 1223, and the fourth rectifier 1224, respectively.

A path switching element of a first individual rectifier connected to a predetermined energy harvester element forms a parallel rectification path with respect to a second energy harvester element, if the corresponding energy harvester element is disconnected from the second energy harvester element. For example, if a voltage of a first waveform, for example, a positive waveform, is output from an energy harvester element connected to an individual rectifier, the corresponding rectifier forms a first rectification path by activating a first path switch and a fourth path switch. In another example, if a voltage of a second waveform, for example, a negative waveform, is output from the energy harvester element, the individual rectifier forms a second rectification path by activating a second path switch and a third path switch. While the first path switch and the fourth path switch are activated, the second path switch and the third path switch are deactivated. Conversely, while the second path switch and the third path switch are activated, the first path switch and the fourth path switch are deactivated.

Hereinafter, a rectification path formed by on-off switching of path switches $SW_{R11}$ through $SW_{R14}$ in the first rectifier 1221, among the four rectifiers 1221, 1222, 1223, and 1224, in an example of N=4 as in FIG. 12, will be described. For example, the first rectifier 1221 forms a first rectification path 1291 by outputting rectified power to an output node through the fourth path switching element $SW_{R14}$, the first energy harvester element 1211, and the first path switching element $SW_{R11}$. The first rectifier 1221 forms the first rectification path 1291 by turning on the fourth path switching element $SW_{R14}$ and the first path switching element $SW_{R11}$ in a portion of a time period during which power with a positive waveform is generated by the first energy harvester element 1211 and by turning off the fourth path switching element $SW_{R14}$ and the first path switching element $SW_{R11}$ in a remaining portion of the time period.

Conversely, the first rectifier 1221 forms a second rectification path 1292 by outputting rectified power to the output node through the third path switching element $SW_{R13}$, the first energy harvester element 1211, and second path switching element $SW_{R12}$. The first rectifier 1221 forms the second rectification path 1292 by turning on the third path switching element $SW_{R13}$ and the second path switching element $SW_{R12}$ in a portion of a time period during which power with a negative waveform is generated by the first energy harvester element 1211 and by turning off the third path switching element $SW_{R13}$ and the second path switching element $SW_{R12}$ in a remaining portion of the time period.

Similarly, the second through fourth energy harvester elements 1212, 1213, and 1214, and the second through fourth rectifiers 1222, 1223, and 1224 also alternately form the first rectification path and the second rectification path.

An example in which energy harvester elements connected as a default array generate power in response to an external energy signal being received, has been described with reference to FIG. 12. The default array indicates a state in which all mode bit values are "0". However, examples are not limited thereto. Mode bit values designated to an array of energy harvester elements may vary depending on design. If an angle alignment error between a vibration axis of the external energy signal and a reception axis of an energy harvester element is small, the individual energy harvester element generates a sufficient current, and thus a sufficiently great voltage is input into a rectifier. In this example, even when a plurality of energy harvester elements are not connected in series, it is possible to operate rectifiers with only a voltage output from individual energy harvester elements, and thus a power providing device 1200 generates power with only the default array.

Further, if a battery is not embedded in the power providing device 1200 or a state of charge is insufficient, a default mode bit value is "0". Thus, the power providing device 1200 operates as an array including a plurality of energy harvester elements connected in parallel, as shown in FIG. 12. The rectifiers may form a rectification path through passive diode elements, even when there is no internal power for switching, which will be described further with reference to FIG. 15. The energy harvester elements connected in parallel are modeled physically like a single energy harvester element with an area the same as a sum of areas of the individual energy harvester elements.

The power providing device 1200 charges a battery and operates the circuit using the array shown in FIG. 12. If the reception axis with respect to the external energy signal is misaligned while the circuit is operating, the power providing device 1200 changes the array of the plurality of energy harvester elements. An example of forming a rectification path by changing the array will be described below with reference to FIGS. 13 and 14.

FIG. 13 illustrates an array including a portion of energy harvester elements connected in series. Among N energy harvester elements 1311, 1312, 1313, and 1314, two or more energy harvester elements are connected to each other in series. A portion of a plurality of connection switching elements $SW_{CF1}$, $SW_{CF2}$, and $SW_{CF3}$, for example, the connection switching elements $SW_{CF1}$ and $SW_{CF3}$, are turned on. Among the N energy harvester elements 1311, 1312, 1313, and 1314, k energy harvester elements are connected in series, and N/k energy harvester elements are connected in parallel. Thus, the array is provided in the size of N/k×k. Here, k is an integer greater than or equal to "1" and less than N, and N is a multiple of k. However, N and k are not limited thereto. An array with N being not a multiple of k will be described below with reference to FIG. 22.

If an energy harvester element connected to a rectifier is connected to one or more other energy harvester elements in series, a path switching element of the rectifier forms a series path with another rectifier connected to one of the other energy harvester elements connected in series. For example, power is transferred to rectifiers connected to an energy harvester element at a first end and an energy harvester element at a second end, among the k energy harvester elements connected in series. For example, if the first energy harvester element 1311 through a k-th energy harvester element are connected in series, a first rectifier 1321 and a k-th rectifier form a rectification path. The first rectifier 1321 and the k-th rectifier rectify power with a series voltage output from the first energy harvester element 1311 through the k-th energy harvester element.

For reference, in the example of FIG. 13, N=2, and k=2. Specifically, if a voltage of a first waveform is output from the first energy harvester element 1311 and the second energy harvester element 1312, the first rectifier 1321 activates the first path switch $SW_{R11}$, and a second rectifier 1322 rectifies the fourth path switch $SW_{R24}$, whereby a first rectification path 1391 is formed. Conversely, if a voltage of a second waveform is output from the first energy harvester element 1311 and the second energy harvester element 1312, the first rectifier 1321 activates the third path switch $SW_{R13}$, and the second rectifier 1322 activates the second path switch $SW_{R22}$, whereby a second rectification path 1392 is formed. In FIG. 13, the first rectification path 1391 is a path along which power passes through the fourth path switching element $SW_{R24}$, the second energy harvester element 1312, the first energy harvester element 1311, and the first path switching element $SW_{R11}$. The second rectification path 1392 is a path along which power passes through the third path switching element $SW_{R13}$, the first energy harvester element 1311, the second energy harvester element 1312, and the second path switching element $SW_{R22}$.

Based on a control signal from a controller, on-off timings of individual path switching elements $SW_{R11}$, $SW_{R13}$, $SW_{R22}$, $SW_{R24}$, $SW_{R31}$, $SW_{R33}$, $SW_{R42}$, and $SW_{R44}$ are controlled. For reference, even when the individual path switching elements are implemented as passive diode elements, the circuit may function as a rectification circuit. An example of passive diode elements will be described below with reference to FIG. 18.

The third energy harvester element 1313 and the fourth energy harvester element 1314 are connected. A third rectifier 1323 operates similar to the first rectifier 1321, and a fourth rectifier 1324 operates similar to the second rectifier 1322.

However, although not shown in FIG. 13, if k>2, a portion of the rectifiers may be excluded from a rectification path. If an energy harvester element connected to a rectifier is connected between other energy harvester elements in series by two or more connection switching elements, a path switching element of the rectifier excludes the rectifier from a rectification path. The second rectifier 1322 through a (k−1)-th rectifier may be excluded from the rectification path. An example of excluding a portion of rectifiers from a rectification path will be described further below with reference to FIG. 14.

If k energy harvester elements are connected in series as described above, power with a voltage of $k \times V_{PZ}$ and a current of $N/k \times I_{PZ}$ is input into a rectifier. Thus, even when a voltage and a current generated by an individual energy harvester element decrease due to misalignment, a power providing device 1300 stably generates rectified power by increasing a voltage input into the rectifier by changing an array.

FIG. 14 illustrates an array including energy harvester elements 1411, 1412, 1413, and 1414 all connected in series. N energy harvester elements 1411, 1412, 1413, and 1414 are connected in series. A plurality of connection switching elements $SW_{CF1}$, $SW_{CF2}$, and $SW_{CF3}$ are all turned on. FIG. 14 illustrates an example in which four energy harvester elements 1411, 1412, 1413, and 1414 are connected in series.

The first through fourth energy harvester elements 1411 through 1414 are connected in series. A first rectifier 1421 and a fourth rectifier 1424 form a rectification path. The first rectifier 1421 and the fourth rectifier 1424 rectify power with a series voltage output from the first through fourth energy harvester elements 1411 through 1414.

For example, if a voltage of a first waveform is output from the first through fourth energy harvester elements 1411 through 1414, the first rectifier 1421 activates a first path switch $SW_{R11}$, and the fourth rectifier 1424 activates a fourth path switch $SW_{R44}$, whereby a first rectification path 1491 is formed. Conversely, if a voltage of a second waveform is output from the first through fourth energy harvester elements 1411 through 1414, the first rectifier 1421 activates a third path switch $SW_{R13}$, and the fourth rectifier 1424 activates a second path switch $SW_{R42}$, whereby a second rectification path 1492 is formed. In FIG. 14, the first rectification path 1491 is a path along which power passes through the fourth path switching element $SW_{R44}$, the fourth energy harvester element 1414, the third energy harvester element 1413, the second energy harvester element 1412, the first energy harvester element 1411, and the first path switching element $SW_{R11}$. The second rectification path 1492 is a path along which power passes through the third path switching element $SW_{R13}$, the first energy harvester element 1411, the second energy harvester element 1412, the third energy harvester element 1413, the fourth energy harvester element 1414, and the second path switching element $SW_{R42}$.

For reference, as described with reference to FIG. 13, if an energy harvester element connected to a rectifier is connected between other energy harvester elements in series by two or more connection switching elements, a path switching element of the rectifier may exclude the rectifier from a rectification path. In FIG. 14, a second rectifier 1422 and a third rectifier 1423 are excluded from the rectification path. The energy harvester elements are modeled as current sources that generate power with substantially the same current, which will be described further below with reference to FIG. 18, and the current does not flow through the second rectifier 1422 and the third rectifier 1423. That is because if the energy harvester elements have the same resonant frequency, the same area, and parallel reception axes, the energy harvester elements generate the same current or similar currents in response to an external energy signal being received.

As described above, if N energy harvester elements are connected in series, power with a voltage of $N \times V_{PZ}$ and a current of $I_{PZ}$ is input into a rectifier. Thus, despite misalignment, a power providing device 1400 stably generates rectified power using the rectifier.

Figure 15:
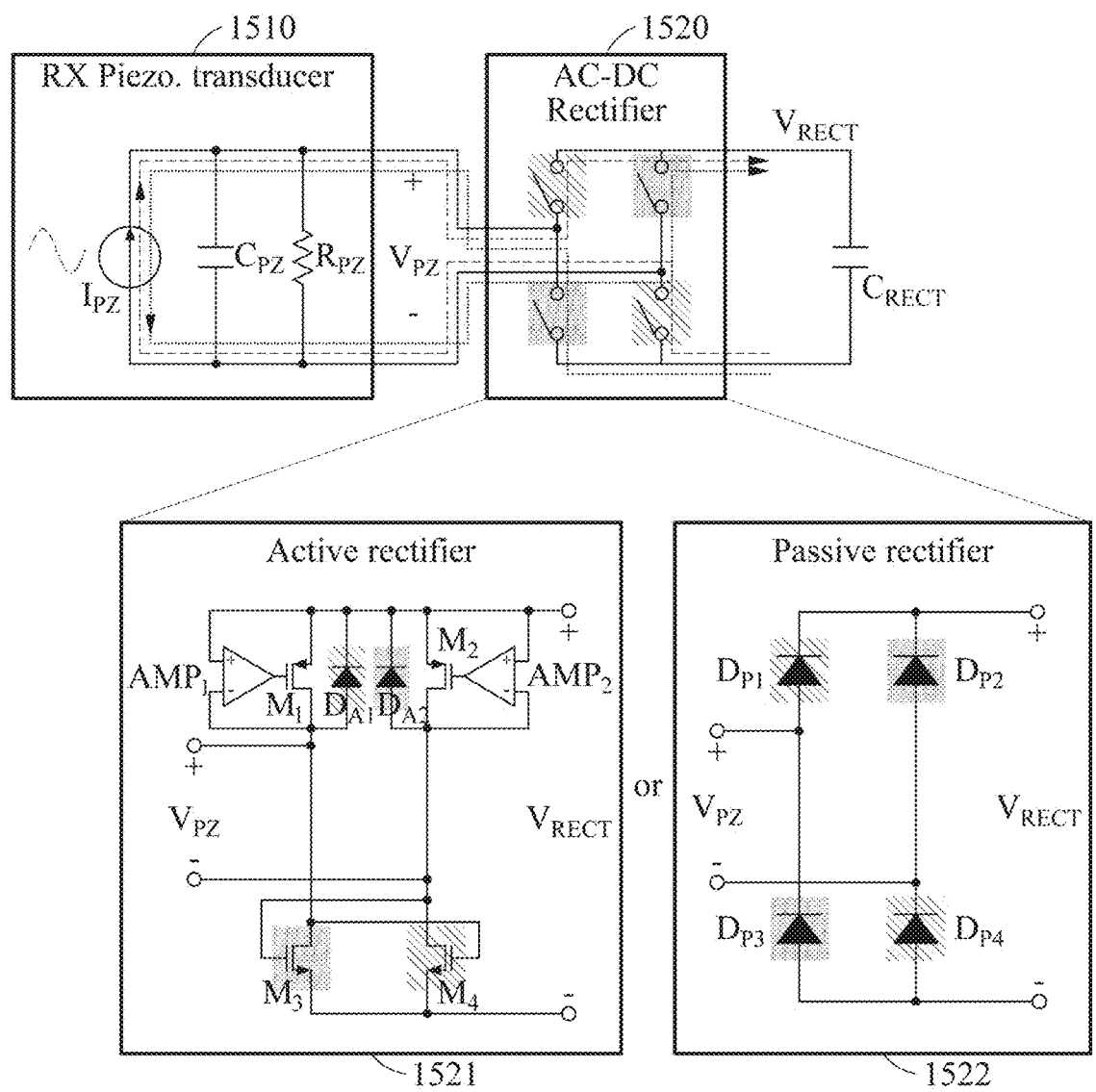
FIG. 15 illustrates an example of elements of a rectifier, in accordance with one or more embodiments.

FIG. 15 illustrates an example of elements of a rectifier.

An energy harvester element 1510 is modeled with a current source $I_{PZ}$, a capacitor $C_{PZ}$, and a resistor $R_{PZ}$, as described above. An output of an individual energy harvester element 1510 is connected to a rectifier 1520. The rectifier 1520 includes a plurality of path switching elements, for example, four path switching elements. The plurality of path switching elements are turned on or off to form or cancel a rectification path. The rectifier 1520 is implemented as an active rectifier 1521 or a passive rectifier 1522. However, examples are not limited thereto.

First, if the rectifier 1520 is implemented as the active rectifier 1521, the path switching elements include passive diode elements and transistor switches. For example, the path switching elements includes a first diode $D_{A1}$, a second diode $D_{A2}$, a first transistor $M_1$, a second transistor $M_2$, a third transistor $M_3$, a fourth transistor $M_4$, a first amplifier $AMP_1$, and a second amplifier $AMP_2$. The first transistor $M_1$ and the second transistor $M_2$ may be configured as P-type metal-oxide-semiconductor field-effect transistors (MOSFETs), and the third transistor $M_3$ and the fourth transistor $M_4$ may be configured as N-type MOSFETs.

For example, a drain terminal of the first transistor $M_1$ and a drain terminal of the third transistor $M_3$ are connected to each other, such that the first transistor $M_1$ and the third transistor $M_3$ are connected in series. The drain terminals of the first transistor $M_1$ and the third transistor $M_3$ are configured as a first input terminal of the rectifier 1520, and are connected to a first output terminal of the energy harvester element 1510. A source terminal of the first transistor $M_1$ is connected to a source terminal of the second transistor $M_2$.

Two input terminals of the first amplifier $AMP_1$ are connected respectively to the drain terminal and the source terminal of the first transistor $M_1$. An output terminal of the first amplifier $AMP_1$ is connected to a gate terminal of the first transistor $M_1$. Thus, as a voltage applied in a forward direction of the first diode $D_{A1}$, which will be described below, increases, an output voltage of the first amplifier $AMP_1$ increases, such that the first transistor $M_1$ is turned on.

The first diode $D_{A1}$ is connected to the first transistor $M_1$ in parallel. For example, an anode of the first diode $D_{A1}$ is connected to the drain terminal of the first transistor $M_1$, and a cathode of the first diode $D_{A1}$ is connected to the source terminal of the first transistor $M_1$. Thus, while the first transistor $M_1$ does not operate, a current flows through the first diode $D_{A1}$ along a first rectification path.

A drain terminal of the second transistor $M_2$ and a drain terminal of the fourth transistor $M_4$ are connected to each other, such that the second transistor $M_2$ and the fourth transistor $M_4$ are connected in series. The drain terminal of the second transistor $M_2$ and the fourth transistor $M_4$ are configured as a first output terminal of the rectifier 1520, and are connected to one end of a load $C_{RECT}$. A source terminal of the second transistor $M_2$ is connected to the source terminal of the first transistor $M_1$.

Two input terminals of the second amplifier $AMP_2$ are connected respectively to the drain terminal and the source terminal of the second transistor $M_2$. An output terminal of the second amplifier $AMP_2$ is connected to a gate terminal of the second transistor $M_2$. Thus, as a voltage applied in a forward direction of the second diode $D_A$, which will be described below, increases, an output voltage of the second amplifier $AMP_2$ increases, such that the second transistor $M_2$ is turned on.

The second diode $D_A$ is connected to the second transistor $M_2$ in parallel. For example, an anode of the second diode $D_A$ is connected to the drain terminal of the second transistor $M_2$, and a cathode of the second diode $D_{A2}$ is connected to the source terminal of the second transistor $M_2$. Thus, while the second transistor $M_2$ does not operate, a current flows through the second diode $D_A$ along a second rectification path. The cathode of the second diode $D_A$ and the source terminal of the second transistor $M_2$ constitute the first output terminal of the rectifier 1520.

The third transistor $M_3$ is connected to the first transistor $M_1$ in series through the drain terminal, as described above. A source terminal of the third transistor $M_3$ is connected to a source terminal of the fourth transistor $M_4$. A gate terminal of the third transistor $M_3$ is connected to the drain terminal of the fourth transistor $M_4$ and a second output terminal of the energy harvester element 1510, and is configured as the second input terminal of the rectifier 1520. Thus, in a period in which a voltage output from the energy harvester element 1510 represents a second waveform, for example, a negative waveform, if a voltage indicated by the second output terminal of the energy harvester element 1510 increases, a voltage applied to the gate terminal of the third transistor $M_3$ is greater than a voltage applied to the source terminal thereof, such that the third transistor $M_3$ is turned on.

The fourth transistor $M_4$ is connected to the second transistor $M_2$ in series through the drain terminal, as described above. The source terminal of the fourth transistor $M_4$ is connected to the source terminal of the third transistor $M_3$. A gate terminal of the fourth transistor $M_4$ is connected to the drain terminal of the third transistor $M_3$ and the first output terminal of the energy harvester element 1510, and is configured as the first input terminal of the rectifier 1520. Thus, in a period in which a voltage output from the energy harvester element 1510 represents a first waveform, for example, a positive waveform, if a voltage indicated by the first output terminal of the energy harvester element 1510 increases, a voltage applied to the gate terminal of the fourth transistor $M_4$ is greater than a voltage applied to the source terminal thereof, such that the fourth transistor $M_4$ is turned on.

A gate terminal of the third transistor M3 is connected to the drain terminal of the fourth transistor M4.

The source terminal of the third transistor $M_3$ and the fourth transistor $M_4$ constitute the second output terminal of the rectifier 1520.

In response to an output voltage $V_{RECT}$ of the rectifier 1520 being greater than or equal to a threshold output, transistor switches $M_1$, $M_2$, $M_3$, and $M_4$ exclude the passive diode elements $D_{A1}$ and $D_{A2}$ and form a rectification path through on-off switching based on a current, for example, a phase of current $I_{PZ}$, output from the energy harvester element 1510.

For example, the output voltage $V_{RECT}$ of the rectifier 1520 corresponds to a voltage of power stored in the load $C_{RECT}$. Thus, if the output voltage $V_{RECT}$ is greater than or equal to the threshold output, the rectifier 1520 forms the first rectification path by turning on the first transistor $M_1$ in the first-waveform period, for example the positive-waveform period, using the power stored in the load $C_{RECT}$. In another example, the rectifier 1520 forms the second rectification path by turning on the second transistor $M_2$ in the second-waveform period, for example, the negative-waveform period, using the power stored in the load $C_{RE}CT$. Since a resistance value of the diode elements $D_{A1}$ and $D_{A2}$ is relatively greater than a resistance value of the turned-on transistor, the diode elements $D_{A1}$ and $D_{A2}$ are naturally excluded from the rectification path.

Further, the passive diode elements $D_{A1}$ and $D_{A2}$ and the transistor switches $M_1$, $M_2$, $M_3$, and $M_4$ form a rectification path in response to the output voltage $V_{RECT}$ of the rectifier 1520 being less than the threshold output, for example, in response to $V_{RECT}$=0V. In detail, if the output voltage $V_{RECT}$ is less than the threshold output, the first transistor $M_1$ and the second transistor $M_2$ are turned off. Since the resistance value of the diode elements $D_{A1}$ and $D_{A2}$ is relatively less than a resistance value of the turned-off transistors, the diode elements $D_{A1}$ and $D_{A2}$ form a rectification path.

Thus, if power, for example, current, is provided from piezoelectric elements, the active rectifier 1521 generates the output voltage $V_{RECT}$ using the passive diode elements connected to the transistor switches in parallel even in an environment in which there is no battery or even when power stored in the battery is less than a threshold power. After that, in response to the output voltage $V_{RECT}$ reaching the threshold output, the active rectifier 1521 forms a rectification path with higher power transducing efficiency by operating the transistor switches.

In another example, the rectifier 1520 is implemented as the passive rectifier 1522. In the passive rectifier 1522, the path switching elements are configured as a plurality of diode elements $D_{P1}$ through $D_{P4}$ disposed to form a rectification path.

For example, the anode of the first diode $D_{P1}$ and the cathode of the third diode $D_{P3}$ are connected and configured as the first input terminal of the rectifier 1520, and the first diode $D_{P1}$ and the third diode $D_{P3}$ are connected in series. The cathode of the first diode $D_{P1}$ and the cathode of the second diode $D_{P2}$ are connected to constitute the first output terminal of the rectifier 1520. The anode of the second diode $D_{P2}$ and the cathode of the fourth diode $D_{P4}$ are connected and configured as the second input terminal of the rectifier 1520, and the second diode $D_{P2}$ and the fourth diode $D_{P4}$ are connected in series. The anode of the third diode $D_3$ and the anode of the fourth diode $D_{P4}$ are connected to each other to constitute the second output terminal of the rectifier 1520. Thus, the plurality of diode elements $D_{P1}$ through $D_{P4}$ constitute a bridge circuit. Due to a high on-voltage (for example, 0.5 V to 0.7 V) of a diode, the rectification path formed by the plurality of diode elements $D_{P1}$ through $D_{P4}$ exhibits a low power transducing efficiency, when compared to the active rectifier 1521.

In a period in which a voltage of power output from the energy harvester element 1510 represents a positive waveform, the first diode $D_{P1}$ and the fourth diode $D_{P4}$ are turned on or activated to form the first rectification path. In a period in which the voltage of power output from the energy harvester element 1510 represents a negative waveform, the second diode $D_{P2}$ and the third diode $D_{P3}$ are turned on to form the second rectification path.

As described above, the rectifier 1520 of a power providing device is implemented as the active rectifier 1521 or the passive rectifier 1522, and stably operates even when little or no power is stored therein.

Figure 16:
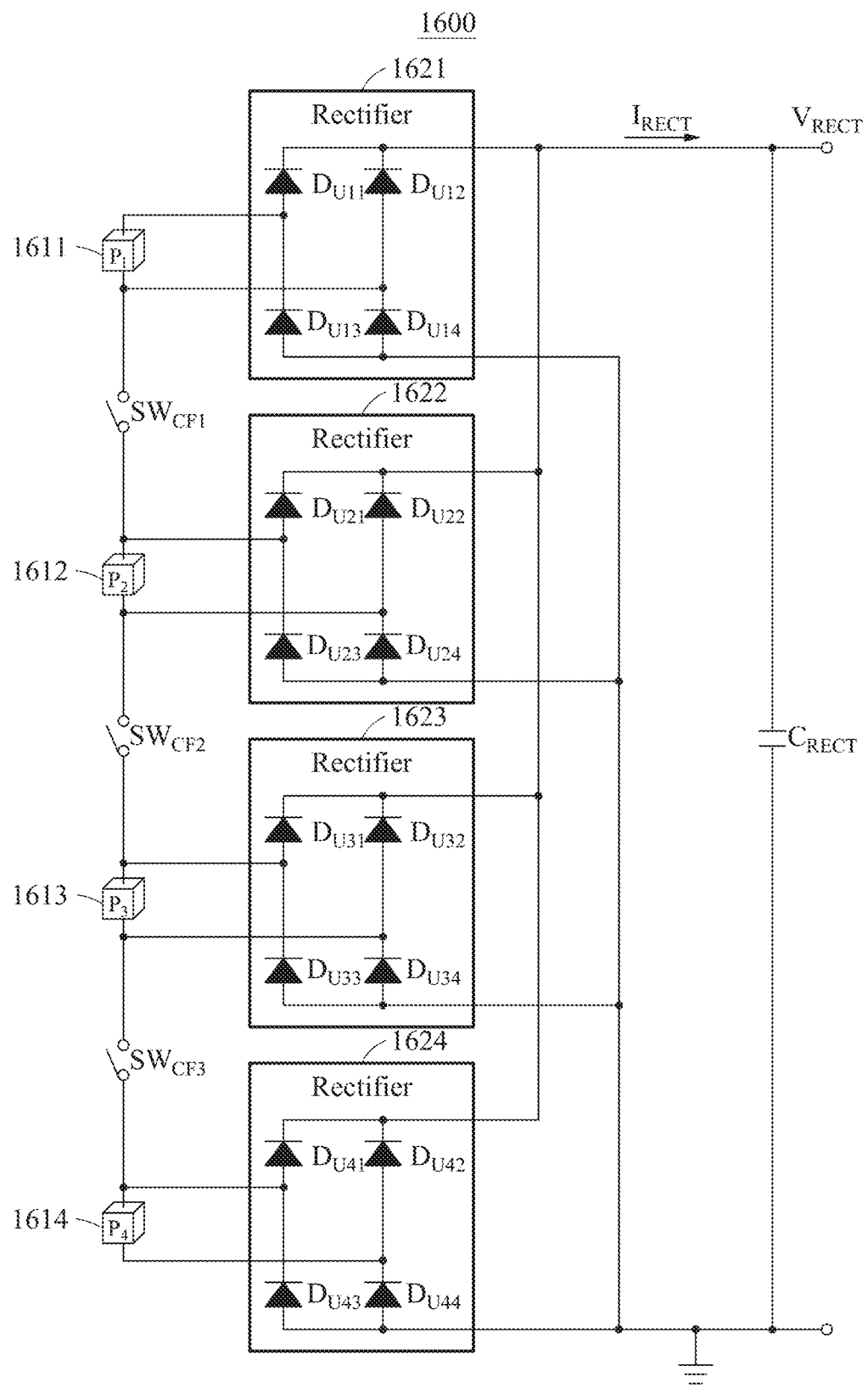
FIG. 16 illustrates an example of a circuit diagram of a power providing device including a rectifier implemented using a passive element, in accordance with one or more embodiments.

FIG. 16 illustrates an example of a circuit diagram of a power providing device including a rectifier implemented using a passive element, in accordance with one or more embodiments.

The rectifier of FIG. 11 may also be implemented as the passive rectifier of FIG. 15. FIG. 16 illustrates an example circuit structure in which passive rectifiers 1621, 1622, 1623, and 1624 are connected to energy harvester elements 1611, 1612, 1613, and 1614.

When an array of the energy harvester elements 1611, 1612, 1613, and 1614 is determined by switching of connection switching elements $SW_{CF1}$, $SW_{CF2}$, and $SW_{CF3}$, passive diode elements $D_{U11}$ through $D_{U44}$ of the passive rectifiers 1621, 1622, 1623, and 1624 form a rectification path corresponding to the determined array, which will be described further below with reference to FIGS. 17 through 19. Rectification paths for arrays will be described below with reference to FIGS. 17 through 19.

For reference, a sum of areas of the passive diode elements $D_{U11}$ through $D_{U44}$ is the same as or similar to a sum of areas of the diodes shown in FIG. 10. Thus, since a power providing device 1600 forms a rectification path corresponding to a change in the array of the energy harvester elements 1611, 1612, 1613, and 1614 using switches and diodes of individual rectifiers, the number and the area of the connection switching elements $SW_{CF1}$, $SW_{CF2}$, and $SW_{CF3}$ used to change the array of the energy harvester elements 1611, 1612, 1613, and 1614 decrease.

Figure 17:
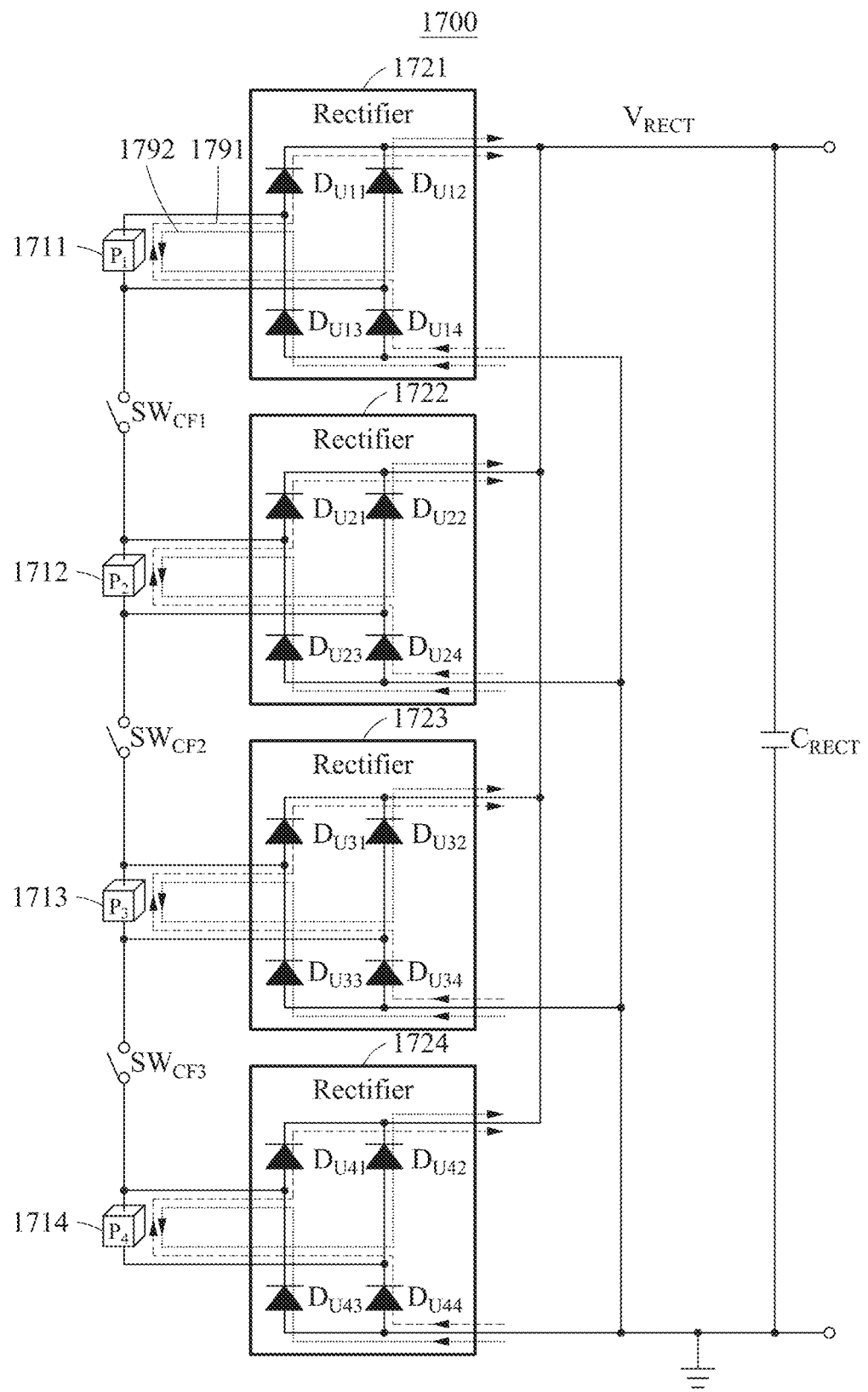
FIGS. 17 through 19 illustrate examples of rectification path for arrays of the power providing device of FIG. 16.
Figure 18:
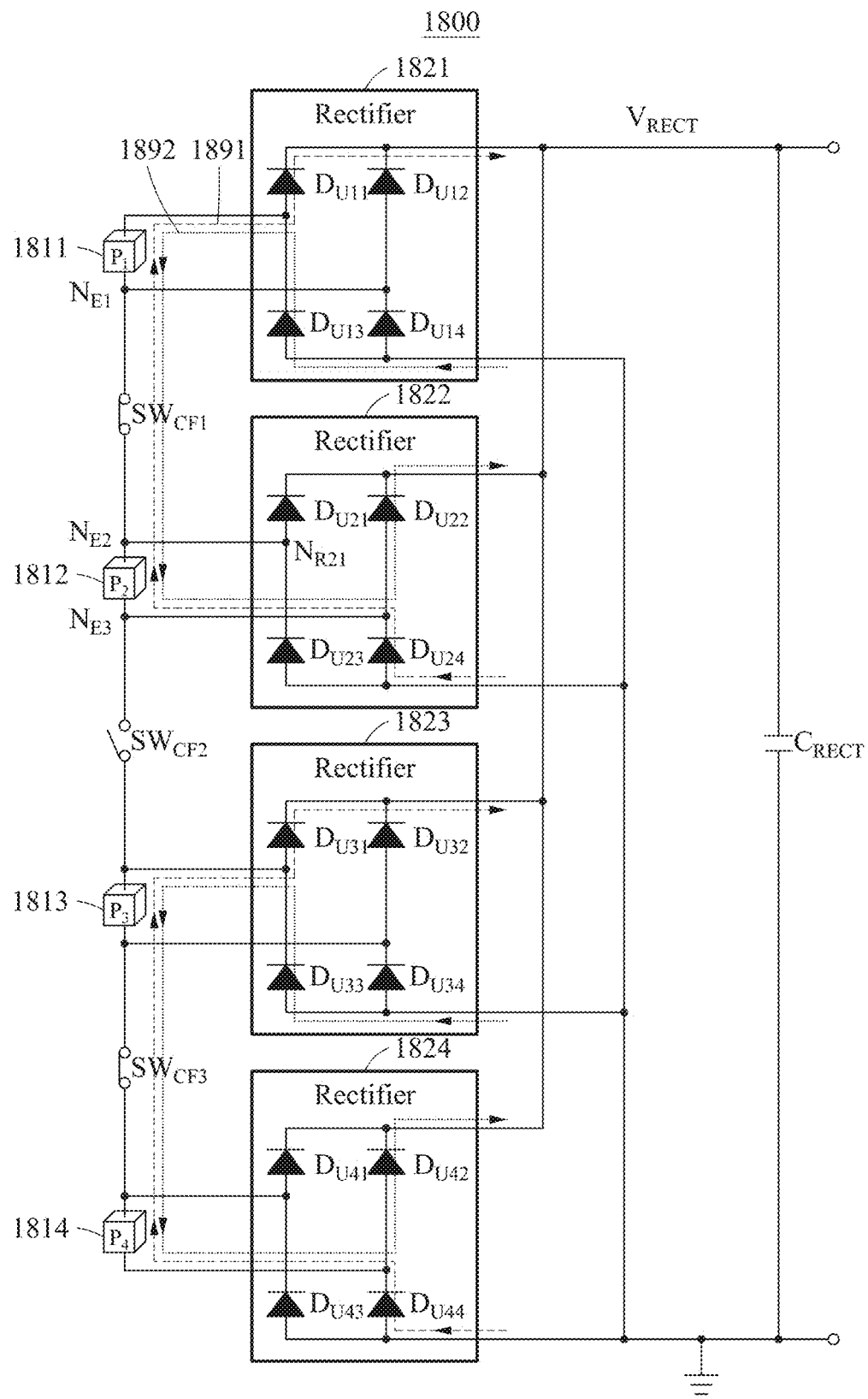
Figure 19:
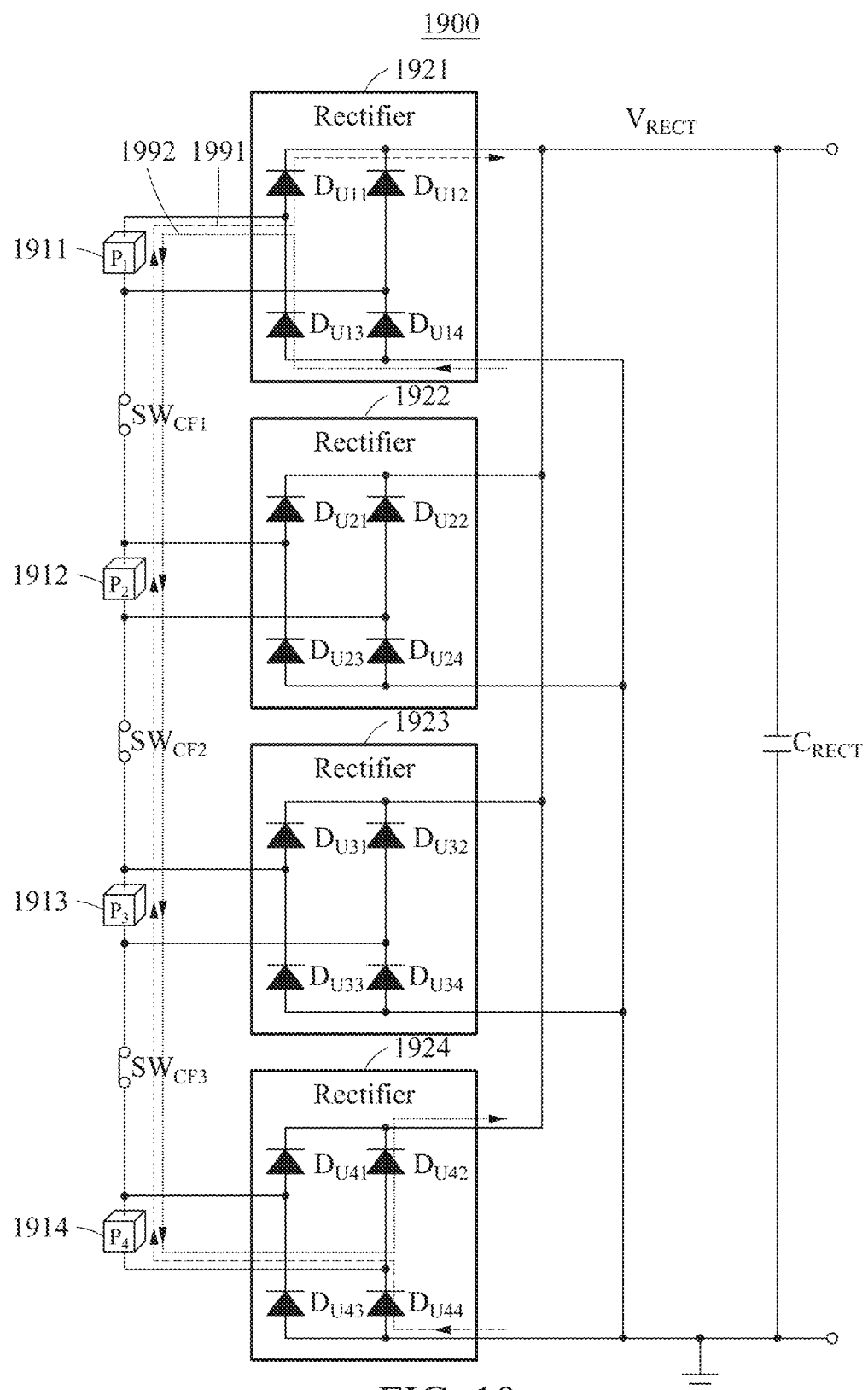

FIGS. 17 through 19 illustrate examples of rectification path for arrays of the power providing device of FIG. 16.

FIG. 17 illustrates an array in which a plurality of energy harvester elements 1711, 1712, 1713, and 1714 are all independently connected in parallel, as similarly illustrated in FIG. 12. Rectifiers 1721, 1722, 1723, and 1724 are configured as passive diode elements, as shown in FIG. 16. Passive diode elements are configured as a bridge circuit in a rectifier, thus the first diode $D_{U11}$ and the fourth diode $D_{U14}$ form a first rectification path 1791, and the second diode $D_{U12}$ and the third diode $D_{U13}$ form a second rectification path 1792.

FIG. 18 illustrates an array in which a portion of a plurality of energy harvester elements 1811, 1812, 1813, and 1814 are connected in series, as similarly illustrated in FIG. 13. Rectifiers 1821, 1822, 1823, and 1824 are configured as passive diode elements, as shown in FIG. 16. Although FIG. 18 illustrates an example in which the path switching elements of the rectifier are configured as passive diode elements, unlike FIG. 13, the example of FIG. 18 forms a rectification path the same as the example of FIG. 13.

For example, the first through fourth energy harvester elements 1811 1812, 1813, and 1814 may be disposed to have the same reception axis or similar reception axes. Similar to the example of FIG. 9, the first through fourth energy harvester elements 1811 1812, 1813, and 1814 are disposed on the same plane. In this example, when a power providing device receives an external energy signal vibrating along a predetermined axis, the first energy harvester element 1811 and the second energy harvester element 1812 are considered as current sources that generate currents of substantially the same level. A large portion of the current generated by the second energy harvester element 1812 is transferred to the first energy harvester element 1811 via both end nodes $N_{E1}$ and $N_{E2}$ of the first connection switching element $SW_{CF1}$. Thus, in an example, the current generated by the second energy harvester element 1812 does not flow through the first diode $D_{U21}$ of the second rectifier 1822. Similarly, the current does not flow through the fourth diode $D_{U14}$ of the first rectifier 1821. As a result, the first diode $D_{U21}$ of the second rectifier 1822 and the fourth diode $D_{U14}$ of the first rectifier 1821 are excluded from a first rectification path 1891. Similarly, the third diode $D_{U23}$ of the second rectifier 1822 and the second diode $D_{U12}$ of the first rectifier 1821 are also excluded from a second rectification path 1892. In the third rectifier 1823 and the fourth rectifier 1824 as well, a portion of passive diode elements is automatically excluded from a rectification path, whereby a rectification path with respect to energy harvester elements to which remaining passive diode elements are connected in series is automatically formed. The remaining elements operate as described with reference to FIG. 13, and thus a duplicated description is omitted herein for conciseness.

FIG. 19 illustrates an array in which a plurality of energy harvester elements 1911, 1912, 1913, and 1914 are all connected in series, as shown in FIG. 14. Rectifiers 1921, 1922, 1923, and 1924 are configured as passive diode elements, as similarly illustrated in FIG. 16. In FIG. 19, path switching elements configured as passive diode elements form rectification paths 1991 and 1992, as described with reference to FIG. 18.

Figure 20:
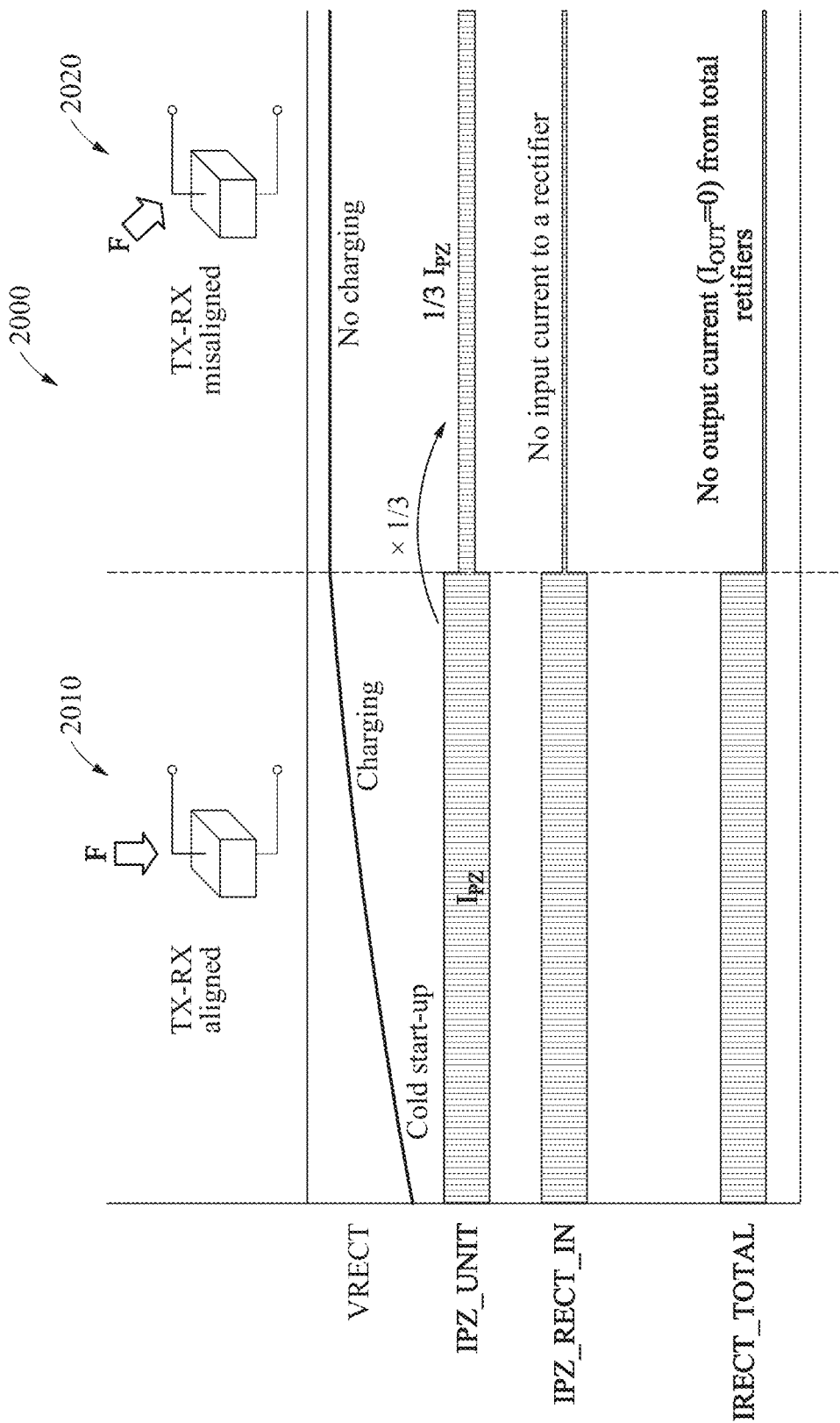
FIGS. 20 and 21 illustrate examples of simulation results showing changes in currents and voltages for arrays of energy harvester elements in a power providing device, in accordance with one or more embodiments.
Figure 21:
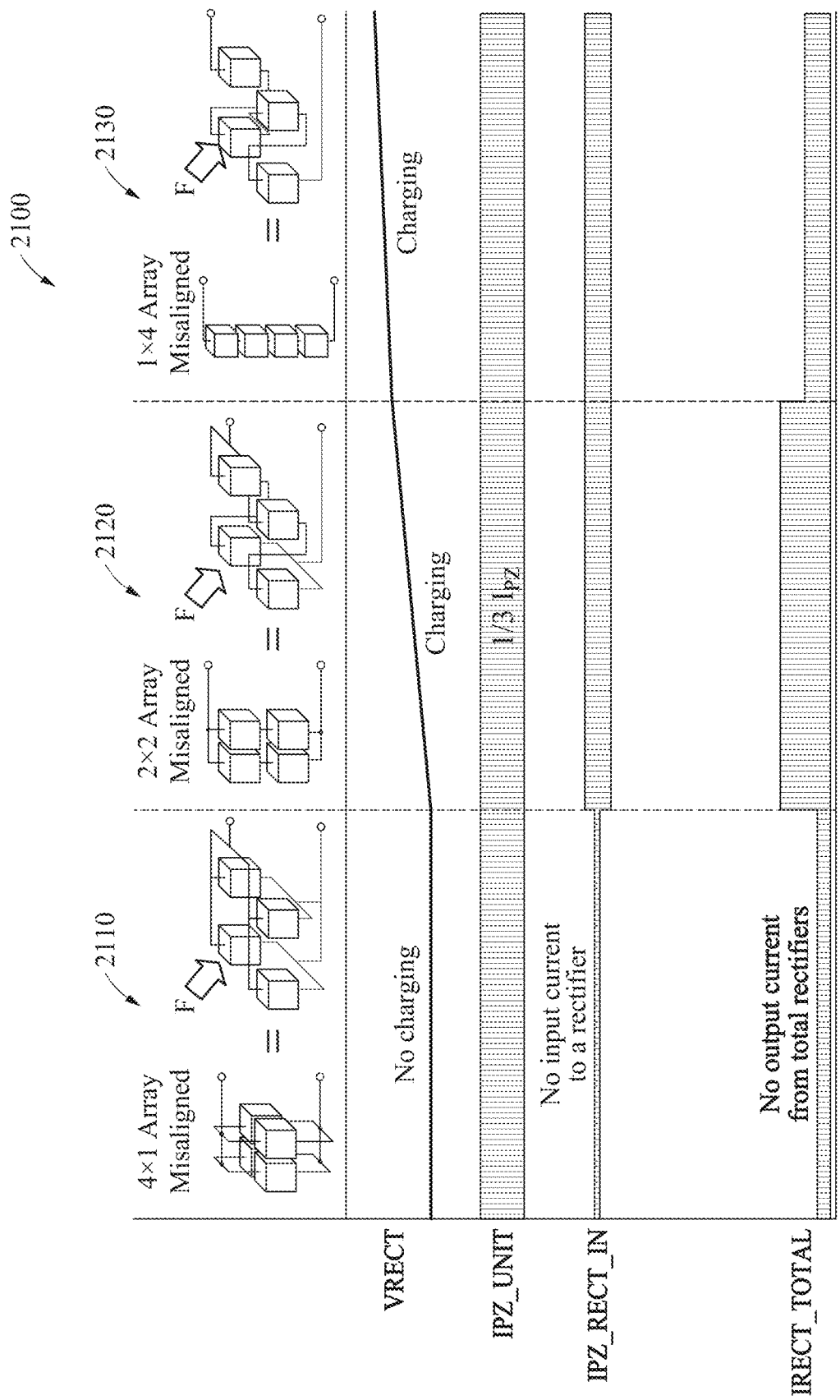

FIGS. 20 and 21 illustrate examples of simulation results showing changes in currents and voltages for arrays of energy harvester elements in a power providing device, in accordance with one or more embodiments.

FIG. 20 illustrates a simulation result 2000 showing an operation in a state 2010 in which a transmission axis and a reception axis are aligned in a single energy harvester element and in a state 2020 in which the transmission axis and the reception axis are misaligned.

First, in the alignment state 2010, the individual energy harvester element generates power of a desired current value $I_{PZ}$. While a current IPZ_UNIT harvested by the individual energy harvester element indicates the desired current value $I_{PZ}$, a voltage sufficient to operate a rectifier is generated. Thus, a current IPZ_RECT_IN input into the rectifier and an output current IRECT_TOTAL of the rectifier may appear. As a result, a capacitor of a load is charged, such that an output voltage VRECT of the rectifier increases.

Conversely, in the misalignment state 2020, the current IPZ_UNIT harvested by the individual energy harvester element decreases. For example, if the harvested current IPZ_UNIT decreases to $1/3 I_{PZ}$, a voltage generated by the single energy harvester element is insufficient to operate the rectifier. Thus, there is no current IPZ_RECT_IN input into the rectifier and there is no output current IRECT_TOTAL of the rectifier. As a result, the charging of the capacitor of the load is suspended, such that the output voltage VRECT of the rectifier does not increase.

FIG. 21 illustrates a simulation result 2100 of a process of generating power even in a misalignment state, by changing an array of energy harvester elements by a power providing device.

First, as described above with reference to FIG. 20, in an example of a default array, for example, a 4×1 array 2110, a current and a voltage output from an individual energy harvester are low in a misalignment state, and thus a rectifier does not operate.

A power providing device switches a connection between an energy harvester element and another energy harvester element through a connection switching element based on a current output from a rectifier. For example, in response to the current output from the rectifier being less than a threshold current, the power providing device additionally connects one or more other harvester elements to the energy harvester element in series using a plurality of connection switching elements. In response to the addition of a second energy harvester element connected to a predetermined first energy harvester element in series, a path switching element of a rectifier connected to the energy harvester element dynamically changes a rectification path. For example, the path switching element forms the rectification path through cooperation with a second rectifier, or excludes a predetermined first rectifier from the rectification path. Through the dynamic change of the rectification path, the power providing device adjusts a voltage applied to an input of a rectifier that forms the rectification path and a current provided to the rectifier.

For example, in a 2×2 array 2120, the current generated by the individual energy harvester element of the power providing device is still $1/3 I_{PZ}$. However, since two energy harvester elements are connected in series, the voltage applied to the rectifier increases. Thus, the current IPZ_RECT_IN input into the rectifier and the output current IRECT_TOTAL of the rectifier are generated. As a result, the capacitor of the load is charged again, such that the output voltage VRECT of the rectifier also increases. Further, if the power providing device changes the array of the energy harvester elements to a 1×4 array 2130, the current IPZ_RECT_IN input into the rectifier remains the same, but the output current IRECT_TOTAL of the rectifier decreases. It is interpreted that although the capacitor of the load is charged, the power transducing efficiency decreases when compared to the 2×2 array 2120.

The power providing device monitors currents output from the rectifier for respective connection states between the first energy harvester element and the one or more second harvester elements, and determines a connection state in which the highest current is output, among the connection states. Thus, in the example of FIG. 21, the power providing device monitors the currents output from the rectifier in the 4×1 array 2110, the 2×2 array 2120, and the 1×4 array 2130, and determines the array of the energy harvester elements to be the 2×2 array 2120 showing the highest current, among the arrays.

Then, the power providing device maintains the determined connection state while power rectified by the rectifier is provided to the load.

Figure 22:
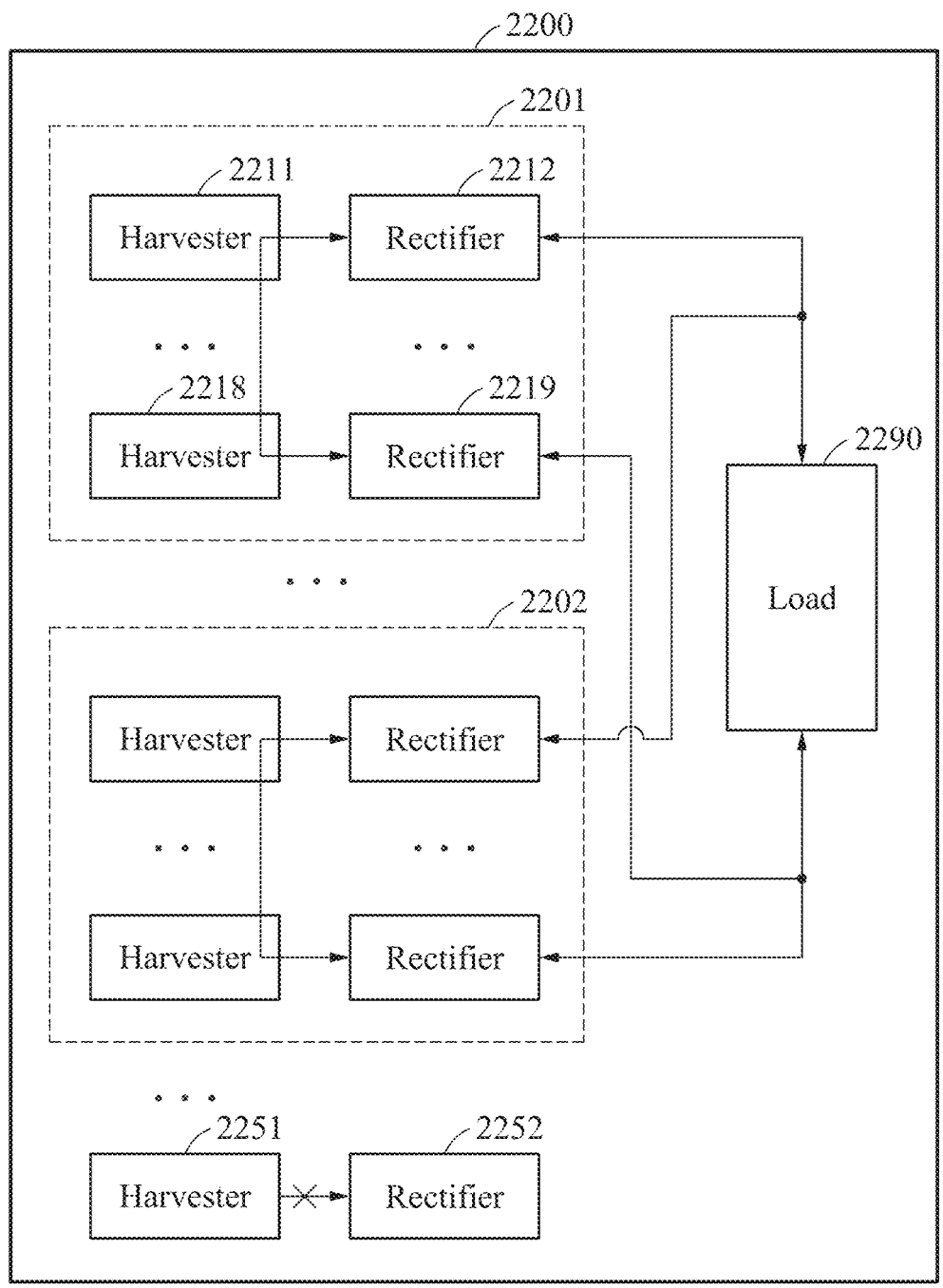
FIG. 22 illustrates an example of grouping a plurality of energy harvesters to form a rectification path in a power providing device, in accordance with one or more embodiments.

FIG. 22 illustrates an example of grouping a plurality of energy harvesters to form a rectification path in a power providing device, in accordance with one or more embodiments.

Referring to FIG. 22, a power providing device 2200 includes a plurality of energy harvester elements, a plurality of rectifiers, and a load 2290.

The plurality of energy harvester elements generate power in response to an external energy signal being received in the power providing device 2200. The plurality of energy harvester elements may be connected through a plurality of connection switching elements. The energy harvester elements are as described above, and thus a detailed description thereof will be omitted for conciseness.

The plurality of connection switching elements switch a connection between the plurality of energy harvester elements. An operation of the connection switching elements is as described above, and thus a detailed description thereof will be omitted for conciseness.

The plurality of rectifiers may be individually connected to the plurality of energy harvester elements. Each of the plurality of rectifiers includes a path switching element configured to dynamically form a rectification path with respect to power generated by the plurality of energy harvester elements in response to the switching of the plurality of connection switching elements. Each rectifier rectifies power with a voltage applied to both ends of the plurality of energy harvester elements, and provides the rectified power to the load 2290, if the plurality of energy harvester elements are connected in series. The load 2290 is connected to an output of the rectifier. A detailed operation of the rectifier is as described above, and thus a detailed description thereof will be omitted for conciseness.

For example, the plurality of energy harvester elements are classified into a plurality of power generating groups by the connection switching elements described above. Energy harvester elements included in each power generating group are connected in series. The number of energy harvester elements connected in series in each power generating group is the same as the number of energy harvester elements connected in series in another power generating group. That is because the plurality of rectifiers transfers the rectified power to the single load 2290, and individual power generating groups should generate similar power to optimize the power transducing efficiency. However, examples are not limited thereto. Individual power generating groups may include different numbers of energy harvester elements.

Additionally, a portion of the plurality of energy harvester elements may be excluded from a power generation operation. For example, an array includes N energy harvester elements, and an individual power generating group includes k energy harvester elements. A first group 2201 includes first through k-th energy harvester elements 2211 through 2218 connected in series, and a first rectifier 2212 and a k-th rectifier 2219 form a rectification path. The first rectifier 2212 and the k-th rectifier 2219 rectify power generated by the first through k-th energy harvester elements 2211 through 2218 connected in series and provide the rectified power to the load 2290. Similarly, an i-th group 2202 includes k energy harvester elements connected in series. Here, i is an integer greater than or equal to "1" and less than or equal to N/k. If N is not an integer multiple of k, $$N - \left\lfloor \frac{N}{k} \right\rfloor * k$$

energy harvester elements are not connected in series. Here, $\lfloor N/k \rfloor$ denotes the greatest integer less than N/k. For example, if N=5 and k=2, "1" energy harvester element is not connected in series. The power providing device 2200 creates a power generating group by connecting the same number of energy harvester elements in series, and excludes the remaining energy harvester element 2251 not belonging to the power generating group from a rectification path. For example, the power providing device 2200 disconnects the remaining harvester element 2251 from a rectifier 2252.

Figure 23:
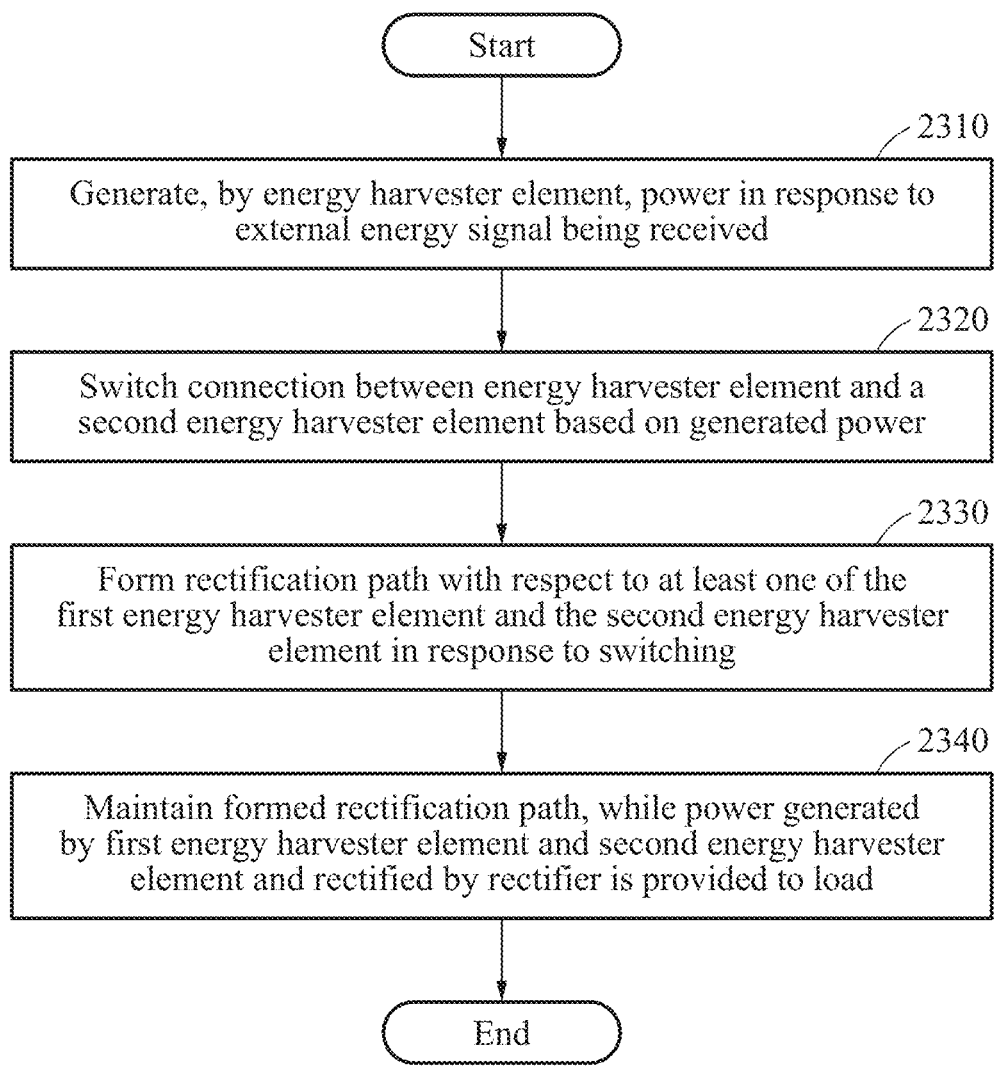
FIG. 23 illustrates an example of a power providing method, in accordance with one or more embodiments.

FIG. 23 illustrates an example of a power providing method. The operations in FIG. 23 may be performed in the sequence and manner as shown, although the order of some operations may be changed or some of the operations omitted without departing from the spirit and scope of the illustrative examples described. Many of the operations shown in FIG. 23 may be performed in parallel or concurrently. One or more blocks of FIG. 23, and combinations of the blocks, can be implemented by special purpose hardware-based computer that perform the specified functions, or combinations of special purpose hardware and computer instructions. In addition to the description of FIG. 23 below, the descriptions of FIGS. 1-22 are also applicable to FIG. 23, and are incorporated herein by reference. Thus, the above description may not be repeated here.

Referring to FIG. 23, in operation 2310, an energy harvester element generates power in response to an external energy signal being received in the power providing device. A configuration and an operation of the energy harvester element are as described above, and thus a detailed description thereof will be omitted for conciseness.

In operation 2320, a power providing device switches a connection between the energy harvester element and a second energy harvester element through a connection switching element based on the generated power. If the connection switching element is configured as a non-volatile memory switch, each connection switching element sets the energy harvester elements as a predesignated default array by forming a connection of a pre-stored state.

In operation 2330, the power providing device forms a rectification path with respect to at least one of the second energy harvester element and the first energy harvester element in response to the switching. For example, in response to a current of the rectified power output from the rectifier being less than a threshold current, the power providing device additionally connects a second energy harvester element to the first energy harvester element in series. Here, the rectification path is formed according to the connection switching configurations of FIGS. 11 through 14, and 16 through 19. However, examples are not limited thereto. The rectification path may also be formed according to the connection switching configuration of FIG. 10.

In operation 2340, the power providing device maintains the formed rectification path, while the power generated by the first energy harvester element and the second energy harvester element and rectified by the rectifier is provided to a load.

The operation of the power providing device is not limited to operations 2310 through 2340 described above. The operation may be performed sequentially or in parallel with at least one of the operations described with reference to FIGS. 1 through 22.

Figure 24:
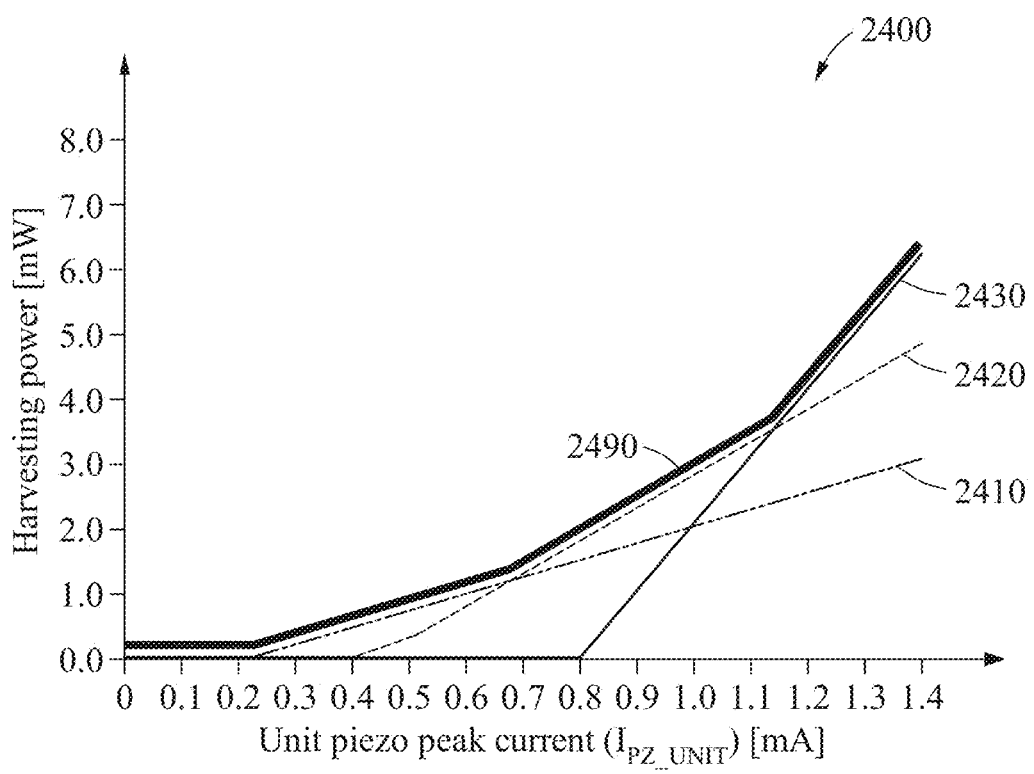
FIG. 24 illustrates an example of a graph showing a range of operating current of a power providing device with respect to a current output from an individual energy harvester element, in accordance with one or more embodiments.

FIG. 24 illustrates an example of a graph showing a range of operating current of a power providing device with respect to a current output from an individual energy harvester element.

In a graph 2400 of FIG. 24, a horizontal axis indicates a current generated by a unit piezoelectric element and measured in mA, and a vertical axis indicates power output from a rectifier and measured in mW. The current generated by the piezoelectric element varies depending on a misalignment angle of a reception axis. In the graph 2400, a first curve 2410 represents a 1×4 array, a second curve 2420 represents a 2×2 array, and a third curve 2430 represents a 4×1 array. According to the first curve 2410, a rectifier of a 1×4-array power providing device outputs power if the unit piezoelectric element outputs at least 0.2 mA. However, the greatest output power is limited to about 3.0 mW. Conversely, according to the third curve 2430, a 4×1-array power providing device exhibits the greatest output power of 6 mW. However, an operation of a rectifier thereof is suspended if the unit piezoelectric element outputs a current of less than 0.8 mA.

The power providing device determines an array corresponding to a current value output from an individual energy harvester element through the rectifier, and forms a connection of a plurality of energy harvester elements using a plurality of connection switching elements based on the determined array. For example, the power providing device stores a lookup table in which the output current value of the rectifier and a mode bit value indicating an array corresponding thereto are mapped. The power providing device searches the lookup table for the array corresponding to the output current value, and connects the energy harvester elements using a connection switching element according to the found array. Hereinafter, for ease of description, array mapping performed based on a current value output from the unit piezoelectric element will be described. However, examples may similarly apply to a lookup table in which a current value output from the rectifier and an array corresponding to the output value are mapped.

The power providing device connects energy harvester elements in an array for generating the greatest power for each range of current output from the individual energy harvester elements. For example, referring to FIG. 24, if the unit piezoelectric element outputs a current in a first current range, for example, 0.2 mA to 0.65 mA, the power providing device connects the energy harvester elements in a first array, for example, the 1×4 array. If the unit piezoelectric element outputs a current in a second current range, for example, 0.65 mA to 1.13 mA, the power providing device connects the energy harvester elements in a second array, for example, the 2×2 array. If the unit piezoelectric element outputs a current in a third current range, for example, 1.13 mA or higher, the power providing device connects the energy harvester elements in a third array, for example, the 4×1 array. Thus, the power providing device generates power according to a curve 2490 which generates the greatest power, while expanding the current range in which the rectifier is operable.

Figure 25:
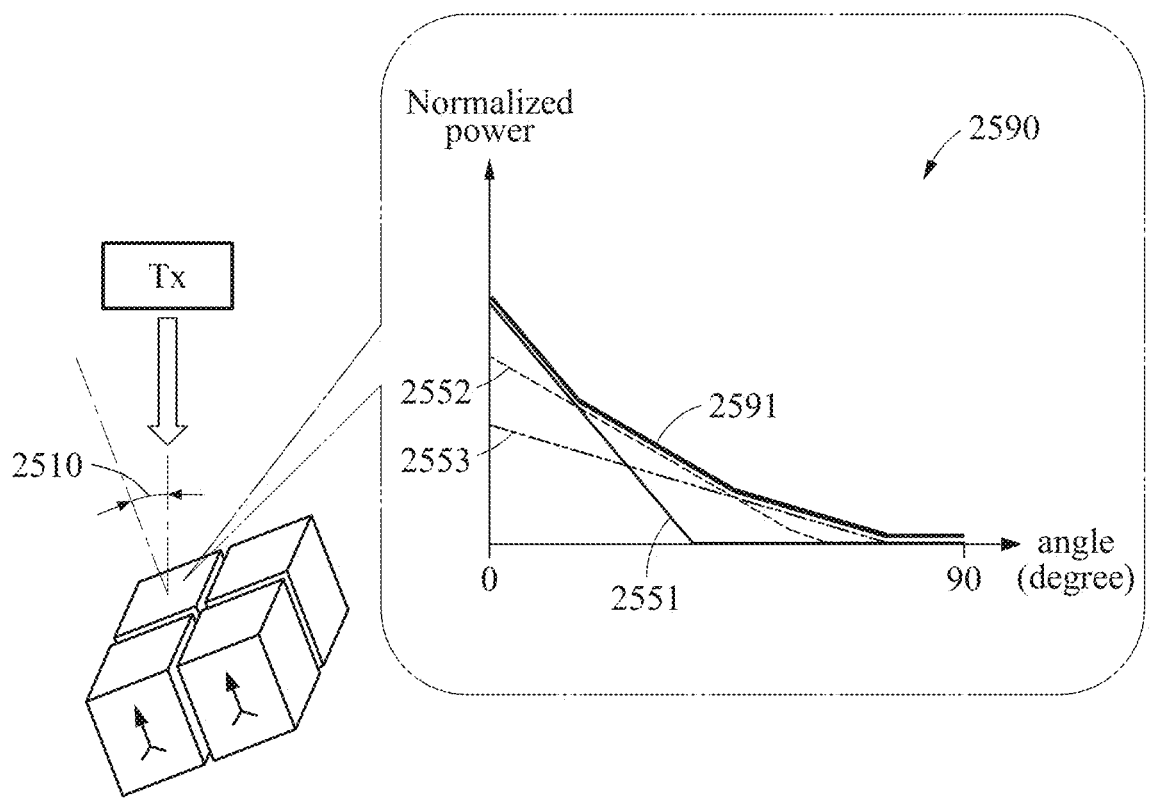
FIG. 25 illustrates an example of a graph showing a range of operating angle with respect to a misalignment between a reception axis and a transmission axis of a power providing device, in accordance with one or more embodiments.

FIG. 25 illustrates an example of a graph showing a range of operating angle with respect to a misalignment between a reception axis and a transmission axis of a power providing device, in accordance with one or more embodiments.

A reception axis of a power providing device may be misaligned with a transmission axis of a power transmitter. A degree of misalignment between the reception axis and the transmission axis is referred to as an angle of error 2510. In a power graph 2590 of FIG. 25, a horizontal axis indicates the angle of error 2510, and a vertical axis indicates a value obtained by normalizing power generated by piezoelectric elements of each generated array.

In the power graph 2590, a first curve 2551 represents power generated by piezoelectric elements of a 4×1 array, for example, four piezoelectric elements connected in parallel, a second curve 2552 represents power generated by piezoelectric elements of a 2×2 array, for example, two piezoelectric elements connected in parallel and two piezoelectric elements connected in series, and a third curve 2553 represents power generated by piezoelectric elements of a 1×4 array, for example, four piezoelectric elements connected in series. If power output from piezoelectric elements connected according to a predetermined array is less than threshold power, a rectifier does not operate, as described above. Thus, piezoelectric elements all connected in parallel as in the first curve 2551 have a narrow range of angle of error for power transducing. The power providing device changes the array of piezoelectric elements, thereby operating according to a curve 2591 with an expanded range of angle of error for power transducing.

The power providing device may perform a cold start-up function, while changing the array of energy harvester elements. Thus, the power providing device may exhibit an optimal power transducing efficiency with respect to an external energy signal received wirelessly, even when implanted in a body.

The power providing device may apply to all applications in which a battery is not freely replaceable and a current output from piezoelectric elements may change significantly depending on a situation. For example, the power providing device may be implemented as an implantable medical device, an Internet of Things (IoT) device, a wearable device, or a hazardous area sensor system.

The power providing systems 100, 200, 310, 400, 600, 710, 1100, 1200, 1300, 1400, 1600, 1700, 1800, 1900, and 2200, described herein with respect to FIGS. 1-25 are implemented as and by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-25 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. The instructions or software may be written using any programming language based on the block diagrams and the flow charts illustrated in the drawings and the corresponding descriptions in the specification, which disclose algorithms for performing the operations performed by the hardware components and the methods as described above.

The instructions or software to control computing hardware, for example, one or more processors or computers to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power providing device, comprising:
   a first energy harvester element, of a plurality of energy harvester elements, configured as a transducer to generate power in response to an external ultrasonic signal being received;
   a connection switching element, of a plurality of connection switching elements, configured to switch, dependent on a rectifying operation of a first rectifier, from a current configuration of the first energy harvester element being connected to a second energy harvester element, of a plurality of energy harvester elements, to a different configuration of the first energy harvester element and the second energy harvester element; and
   the first rectifier comprising one or more path switching elements configured to change a rectification path in response to the switching of the connection switching element,
   wherein the first rectifier is connected to the first energy harvester element to rectify the power generated by the first energy harvester element along the rectification path.

2. The power providing device of claim 1, wherein in response to the different configuration having the first energy harvester element being connected in series with one or more other energy harvester elements of the plurality of energy harvester elements, the one or more path switching elements form a series path with a second rectifier connected to the second energy harvester elements.

3. The power providing device of claim 1, wherein, in response to the different configuration having the first energy harvester element being connected in series between two or more second energy harvester elements, of the plurality of energy harvester elements, by two or more connection switching elements of the plurality of connection switching elements, the path switching element excludes the first rectifier from the rectification path.

4. The power providing device of claim 1, wherein in response to the different configuration having the first energy harvester element being disconnected from the second energy harvester element, the path switching element forms a parallel rectification path with respect to the second energy harvester element.

5. The power providing device of claim 1, wherein the connection switching element is configured to:
   connect the first energy harvester element in series with the second energy harvester element in response to a connection signal that is dependent on an output of the first rectifier, and
   disconnect the first energy harvester element from the second energy harvester element in response to a disconnection signal that is dependent on the output of the first rectifier.

6. The power providing device of claim 1, wherein the power providing device is configured to switch, based on a current output from the first rectifier, to the different configuration using the connection switching element.

7. The power providing device of claim 6, wherein in response to the current output from the first rectifier being determined less than a threshold current, the different configuration includes one or more second energy harvester elements, of the plurality of energy harvester elements, being connected in series with the first energy harvester element using a plurality of connection switching elements.

8. The power providing device of claim 6, wherein the power providing device is configured to monitor currents output from the first rectifier for respective connection states between the first energy harvester element and one or more second harvester elements of the plurality of energy harvester elements, and determine a connection state, with a corresponding configuration of the first energy harvester element being connected to the second energy harvester element, in which a highest current is output, among the respective connection states.

9. The power providing device of claim 8, wherein the power providing device is configured to maintain the determined connection state while the power rectified by the first rectifier is provided to a load.

10. The power providing device of claim 6, wherein the power providing device is configured to determine an array, to select the different configuration, corresponding to a current value output from individual energy harvester elements through the first rectifier, and form a connection of a plurality of energy harvester elements using a plurality of connection switching elements based on the determined array.

11. The power providing device of claim 1, wherein the connection switching element is configured as a non-volatile memory switch to maintain one of a connection state and a disconnection state between the first energy harvester element and the second energy harvester element based on a pre-stored switching state.

12. The power providing device of claim 1, further comprising:
   a load connected to an output of the first rectifier,
   wherein in response to the different configuration having a plurality of energy harvester elements being connected in series, the first rectifier rectifies power with a voltage applied to a first end of the plurality of energy harvester elements and a second end of the plurality of energy harvester elements, and provides the rectified power to the load.

13. The power providing device of claim 1, wherein the first energy harvester element and the second energy harvester element are formed of a material that vibrates in response to the receiving of the external energy signal, and the first energy harvester element and the second energy harvester element have a same resonant frequency.

14. The power providing device of claim 1, wherein the first energy harvester element and the second energy harvester element are disposed on a same plane and have reception axes parallel to each other.

15. The power providing device of claim 1, wherein the one or more path switching elements comprise a plurality of diode elements disposed to form the rectification path.

16. The power providing device of claim 1, wherein the one or more path switching elements comprise:
passive diode elements and transistor switches,
wherein the passive diode elements and the transistor switches are configured to form the rectification path in response to an output voltage of the first rectifier being determined less than a threshold output, and
the transistor switches exclude the passive diode elements and form the rectification path through on-off switching based on a current output from the first energy harvester element, in response to the output voltage of the first rectifier being determined greater than or equal to the threshold output.

17. A power providing device, comprising:
a plurality of energy harvester elements configured as transducers to generate power in response to an external ultrasonic signal being received;
a plurality of connection switching elements configured to switch, dependent on a rectifying operation of a rectifier, from a current configuration, of one or more of the plurality of energy harvester elements being connected to another one or more of the plurality of energy harvester elements, to a different configuration of the one or more of the plurality of energy harvester elements and the other one or more of the plurality of energy harvester elements; and
a plurality of rectifiers, including the rectifier, individually connected to the plurality of energy harvester elements,
wherein the plurality of rectifiers each include a path switching element configured to form a rectification path with respect to the power generated by the plurality of energy harvester elements in response to the switching of the plurality of connection switching elements.

18. A power providing method performed by a power providing device, the power providing method comprising:
generating, by a first energy harvester element configured as a transducer, power in response to an external ultrasonic signal being received in vivo;
switching, dependent on a rectify operation of a rectifier, from a current configuration of the first energy harvester element being connected to a second energy harvester element to a different configuration of the first energy harvester element and the second energy harvester element;
forming a rectification path with respect to at least one of the first energy harvester element and the second energy harvester element in response to the switching;
rectifying, by the rectifier, the power generated by the first energy harvester element along the rectification path; and
maintaining the formed rectification path, while the power generated by the first energy harvester element and the second energy harvester element and rectified by the rectifier is provided to a load.

19. The power providing method of claim 18, wherein the forming of the rectification path comprises additionally connecting the second energy harvester element to the first energy harvester element in series, in response to a current of the rectified power output from the rectifier being determined less than a threshold current.

20. A power providing device, comprising:
a battery;
a plurality of piezoelectric elements connected to the battery, the plurality of piezoelectric elements configured to transduce power in response to an ultrasonic signal being received, and provide the transduced power to the battery; and
a switching element configured to selectively, dependent on a rectified current corresponding to at least one of the plurality of piezoelectric elements, switch between a series connection of the plurality of piezoelectric elements and a parallel connection of the plurality of piezoelectric elements, wherein one of the series connection of the plurality of piezoelectric elements and the parallel connection of the plurality of piezoelectric elements is selected based on a current value output of a respective rectified current.

21. The power providing device of claim 20, wherein the plurality of piezoelectric elements are configured to transduce the power when disposed at a depth, from an exterior surface, of greater than 5 cm in a human body.

22. The power providing device of claim 20, wherein the plurality of piezoelectric elements include four or more piezoelectric elements.

23. The power providing device of claim 20, wherein a size of each of the plurality of piezoelectric elements is less than or equal to 5 mm.

24. The power providing device of claim 20, wherein the one of the series connection of the plurality of piezoelectric elements and the parallel connection of the plurality of piezoelectric elements is selected further based on a state of charge of the battery.

25. The power providing device of claim 20, further comprising:
a rectifier connected to each of the plurality of piezoelectric elements.

26. The power providing device of claim 20, wherein the power providing device is configured to increase a number of piezoelectric elements connected in series, among the plurality of piezoelectric elements, using the switching element, in response to the current value output from the rectifier being determined less than a threshold current.

27. The power providing device of claim 20, wherein the switching element is configured as a non-volatile memory switch to maintain one of the series connection of the plurality of piezoelectric elements and the parallel connection of the plurality of piezoelectric elements based on a pre-stored switching state.

28. The power providing device of claim 20, wherein the power providing device is configured to maintain a connection state of the plurality of piezoelectric elements while power rectified by a rectifier is provided to the battery.

29. A power providing system, comprising:
a transmitter configured to transmit an external ultrasonic signal;

a bio-implant device configured to receive the transmitted external ultrasonic signal, and transduce power based on the received external ultrasonic signal,
wherein the bio-implant device comprises
a plurality of energy harvester elements connected in one of a series mode and a parallel mode;
a rectifier; and
a connection switching element configured to switch, dependent on a current output from the rectifier being determined less than a threshold current, from a current configuration, of one or more of the plurality of energy harvester elements being connected to another one or more of the plurality of energy harvester elements, to a different configuration of the one or more of the plurality of energy harvester elements and the other one or more of the plurality of energy harvester elements.

30. The power providing system of claim 29, wherein the bio-implant device is configured to monitor currents output from the rectifier for the respective changes in the arrays of energy harvester elements, and determine a connection state in which a highest current is output, among the respective arrays.

\* \* \* \* \*